(12) United States Patent
Mendel et al.

(10) Patent No.: US 7,287,171 B1
(45) Date of Patent: Oct. 23, 2007

(54) SYSTEMS AND METHODS FOR REDUCING STATIC AND TOTAL POWER CONSUMPTION IN PROGRAMMABLE LOGIC DEVICE ARCHITECTURES

(75) Inventors: David Mendel, Sunnyvale, CA (US); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 409 days.

(21) Appl. No.: 10/796,502

(22) Filed: Mar. 8, 2004

(51) Int. Cl.
*G06F 1/00* (2006.01)
*G06F 11/30* (2006.01)

(52) U.S. Cl. .................. 713/300; 713/323; 713/330; 713/340

(58) Field of Classification Search .............. None
See application file for complete search history.

(56) References Cited

U.S. PATENT DOCUMENTS

| | | | |
|---|---|---|---|
| 6,407,576 B1 | 6/2002 | Ngai et al. ............... 326/41 |
| 6,621,325 B2 * | 9/2003 | Hart et al. ............... 327/534 |
| 6,630,717 B2 * | 10/2003 | Ashida .................. 257/369 |
| 6,759,873 B2 * | 7/2004 | Kang et al. ............. 326/81 |
| 6,777,978 B2 | 8/2004 | Hart et al. ............... 326/38 |
| 7,082,048 B2 * | 7/2006 | Choi .................... 365/149 |
| 2003/0203558 A1 * | 10/2003 | Lowrey ................. 438/202 |
| 2004/0113672 A1 * | 6/2004 | Kang et al. ............. 327/185 |
| 2004/0216074 A1 * | 10/2004 | Hart et al. ............... 716/16 |
| 2004/0217775 A1 * | 11/2004 | Turner .................. 326/39 |
| 2006/0227593 A1 * | 10/2006 | Choi .................... 365/149 |

OTHER PUBLICATIONS

Jason H. Anderson and Farid N. Najm, "A Novel Low-Power FPGA Routing Switch" (2004) (unpublished, submitted to the 2004 IEEE Custom Integrated Circuits Conference, Orlando, Florida, Oct. 3-6, 2004).

Jason H. Anderson et al., "Active Leakage Power Optimization for FPGAs", 2004 ACM/SIGDA Twelfth International Symposium on Field Programmable Gate Arrays, Monterey, California, pp. 33-41 (Feb. 22-24, 2004).

Jason H. Anderson and Farid N. Najm, "Low-Power Programmable Routing Circuitry for FPGAs" (2004) (unpublished, submitted to the 2004 International Conference on Computer Aided Design, San Jose, California, Nov. 7-11, 2004).

Deming Chen and Jason Cong, "Low-Power Technology Mapping for FPGA Architectures with Dual Supply Voltages", 2004 ACM/SIGDA Twelfth International Symposium on Field Programmable Gate Arrays, Monterey, California, pp. 109-117 (Feb. 22-24, 2004).

A. Gayasen et al., "Reducing Leakage Energy in FPGAs Using Region-Constrained Placement", 2004 ACM/SIGDA Twelfth International Symposium on Field Programmable Gate Arrays, Monterey, California, pp. 51-58 (Feb. 22-24, 2004).

(Continued)

*Primary Examiner*—Rehana Perveen
*Assistant Examiner*—Michael J. Brown
(74) *Attorney, Agent, or Firm*—Ropes & Gray LLP; Jeffrey H. Ingerman

(57) ABSTRACT

A method and system for reducing power consumption in a programmable logic device (PLD) is provided. The power consumption may be reduced by preferably continually considering power consumption as a factor in circuit design during the synthesis, placement, routing, and period following routing of the programmable logic device.

12 Claims, 20 Drawing Sheets

OTHER PUBLICATIONS

Fei Li et al., "Low-Power FPGA Using Pre-defined Dual-Vdd/Dual-Vt Fabrics", 2004 ACM/SIGDA Twelfth International Symposium on Field Programmable Gate Arrays, Monterey, California, pp. 42-50 (Feb. 22-24, 2004).

Fei Li et al., "FPGA Power Reduction Using Configurable Dual-Vdd", 2004 Design Automation Conference, San Diego, California, pp. 735-740 (Jun. 7-11, 2004).

Arifur Rahman and Vijay Polavarapuv, "Evaluation of Low-Leakage Design Techniques for Field Programmable Gate Arrays", 2004 ACM/SIGDA Twelfth International Symposium on Field Programmable Gate Arrays, Monterey, California, pp. 23-30 (Feb. 22-24, 2004).

"Mercury Programmable Logic Device Family", Data Sheet, Version 2.2, Altera Corporation, pp. 17-28 (Jan. 2003).

* cited by examiner

SYSTEMS AND METHODS FOR REDUCING STATIC AND TOTAL POWER CONSUMPTION IN PROGRAMMABLE LOGIC DEVICE ARCHITECTURES

STATEMENT OF RELATED CASE

This application is being filed together with co-pending U.S. patent application Ser. No. 10/796,501, entitled, "Systems and Methods for Reducing Static and Total Power Consumption in a Programmable Logic Device," which is hereby incorporated by reference herein in its entirety.

BACKGROUND OF THE INVENTION

This invention relates to reducing static and total power in electronic devices. More particularly, this invention relates to reducing static and total power consumption in a programmable logic device (PLD)[1].

[1] The term PLD as used in this patent is intended to cover the broad space of programmable logic. This includes devices commonly known as CPLDs (Complex Programmable Logic Devices) such as MAX 7000 from Altera Corp. of San Jose Calif., FPGAs (Field Programmable Gate Arrays) such as Stratix from Altera, or Structured ASICs (metal programmable logic) such as Hardcopy from Altera.

Gate thickness of transistors in PLDs have always trended thinner and thinner. As the gate thicknesses approach 90 nanometers, the transistors do not fully turn OFF. Thus, a pass gate in the OFF position continues to pass some current. It follows that the source of power consumption in the static state of such a PLD having thin gate thicknesses tends to come from the leakage of any transistor in the PLD because the power required maintain transistor states increases.

There is also an additional gate leakage effect that exists at 90 nm gate thickness but which becomes very large at 65 nm—(and smaller) gate thickness. This additional gate leakage effect may be either gate to substrate leakage or gate to source/drain leakage.

PLDs are typically designed with a multitude of field-effect transistors (FETs). When a FET is turned OFF, the leakage depends for the most part on whether there is a voltage difference between the source and the drain. The majority of power consumption in the static state of a PLD which implements 90 nanometer line widths comes from leakage of FETs. The leakage of the FETs results from a voltage differential existing between the drain and the source combined with the transistor not fully turning itself OFF.

Therefore, it would be desirable to optimize a PLD to consume less power, even at relatively narrow gate widths, while maintaining the level of the functionality of the PLD.

SUMMARY OF THE INVENTION

It is an object of this invention to optimize a PLD to consume less power, even at relatively narrow gate widths, while maintaining the level of the functionality of the PLD.

Systems and methods for reducing static and total power in a PLD according to the invention are provided. The systems and methods preferably reflect concepts that can be implemented to reduce leakage current of FETs as well as other power-saving concepts in a PLD. It should be noted that the effect of implementing these concepts should preferably be weighed against the deleterious effects of the implementation of these concepts on other PLD areas of importance—e.g., routability, CAD run time, and speed of the circuitry implemented on the PLD.

Another important power saving concept may be implemented during routing of the PLD circuitry. This concept may include routing the PLD circuitry, where possible and/or efficient, in a minimum power configuration.

Systems and method for reducing power according to the invention also preferably may be implemented to reduce dynamic power consumption as well as static power and total power consumption.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

It is common in programmable logic devices to provide logic elements which are based on look-up tables. For example, programmable logic devices, including APEX and STRATIX devices, available from Altera Corporation, of San Jose, Calif., may include logic elements built at least in part around four-input look-up tables. The logic elements can be programmed and programmably interconnected to simulate any logic function.

Figure 1:
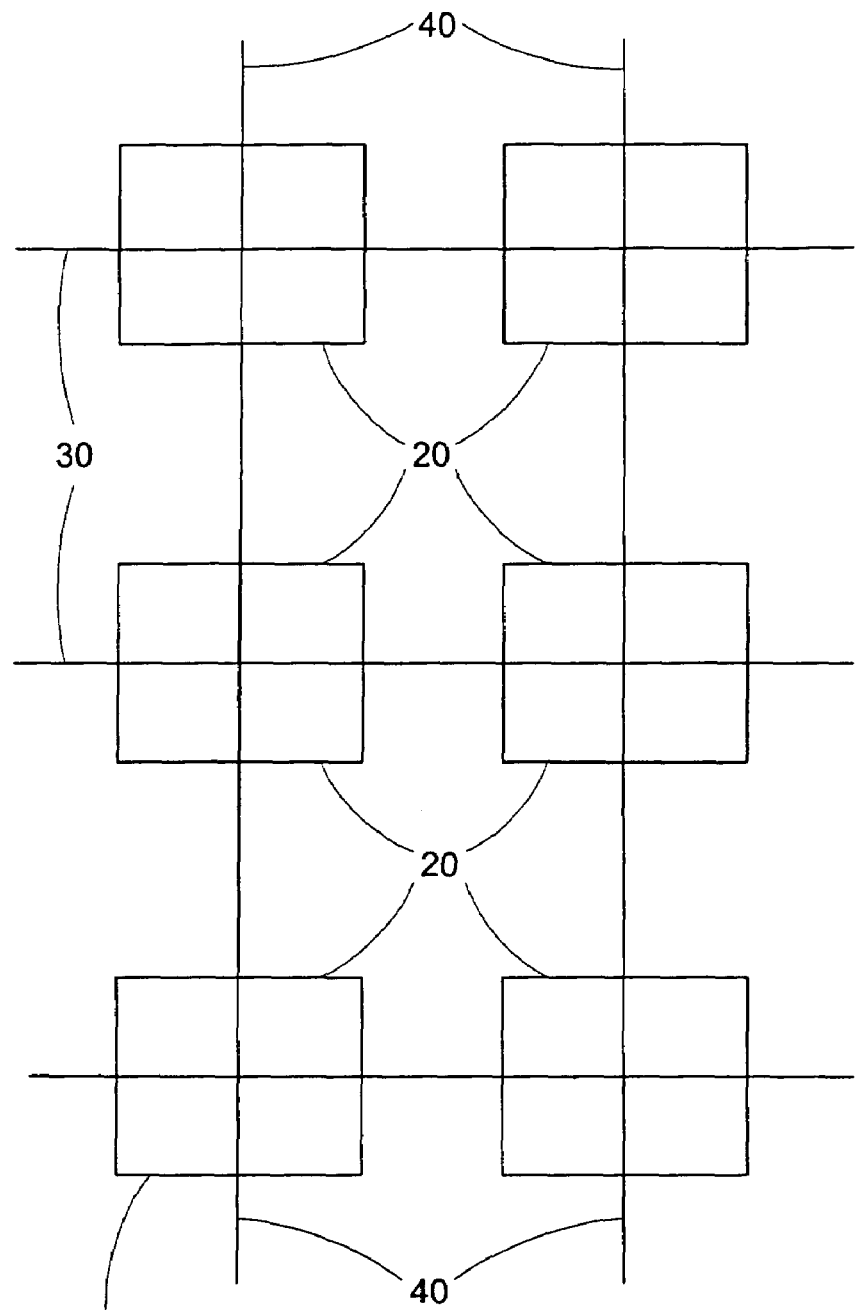
FIGS. 1-11 are schematic diagrams for circuits upon which methods and systems according to the invention may be implemented.

The following is a short introduction to the layout and interconnection schemes of PLDs in order to better understand the systems and methods according to the invention. The general layout and interconnection scheme employed in an APEX-type PLD is illustrated in FIG. 1. As shown, PLD 10 includes a number of "groups of programmable logic array blocks" 20 (GOLs). GOLs 20 are interconnected in the horizontal direction by horizontal interconnection conductors 30 (H conductors) and in the vertical direction by vertical interconnection conductors 40 (V conductors). Although not shown in FIG. 1, device 10 has I/O circuitry and pins (for connecting PLD 10 to external circuitry) disposed around the periphery of the device.

Figure 2:
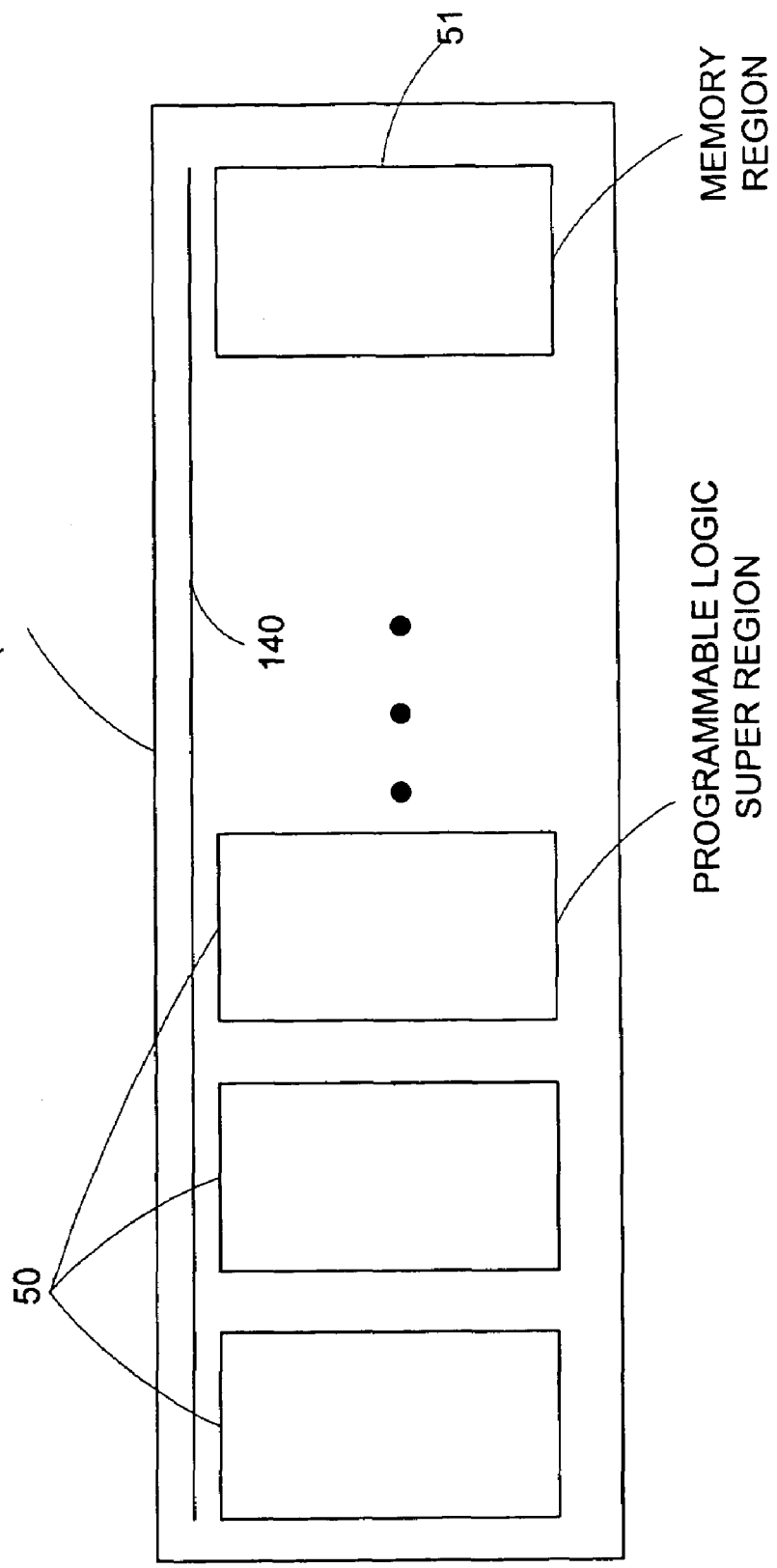

A typical GOL 20 is shown in more detail in FIG. 2. As shown, GOL 20 includes several programmable logic regions or LABs 50. Each GOL 20 also includes a memory region 51, which contains a configurable block of random access memory (RAM) such as static random access memory (SRAM). Interconnection conductors 140 are provided for conveying signals among the logic and memory regions 50 and 51 of the GOL.

Figure 3:
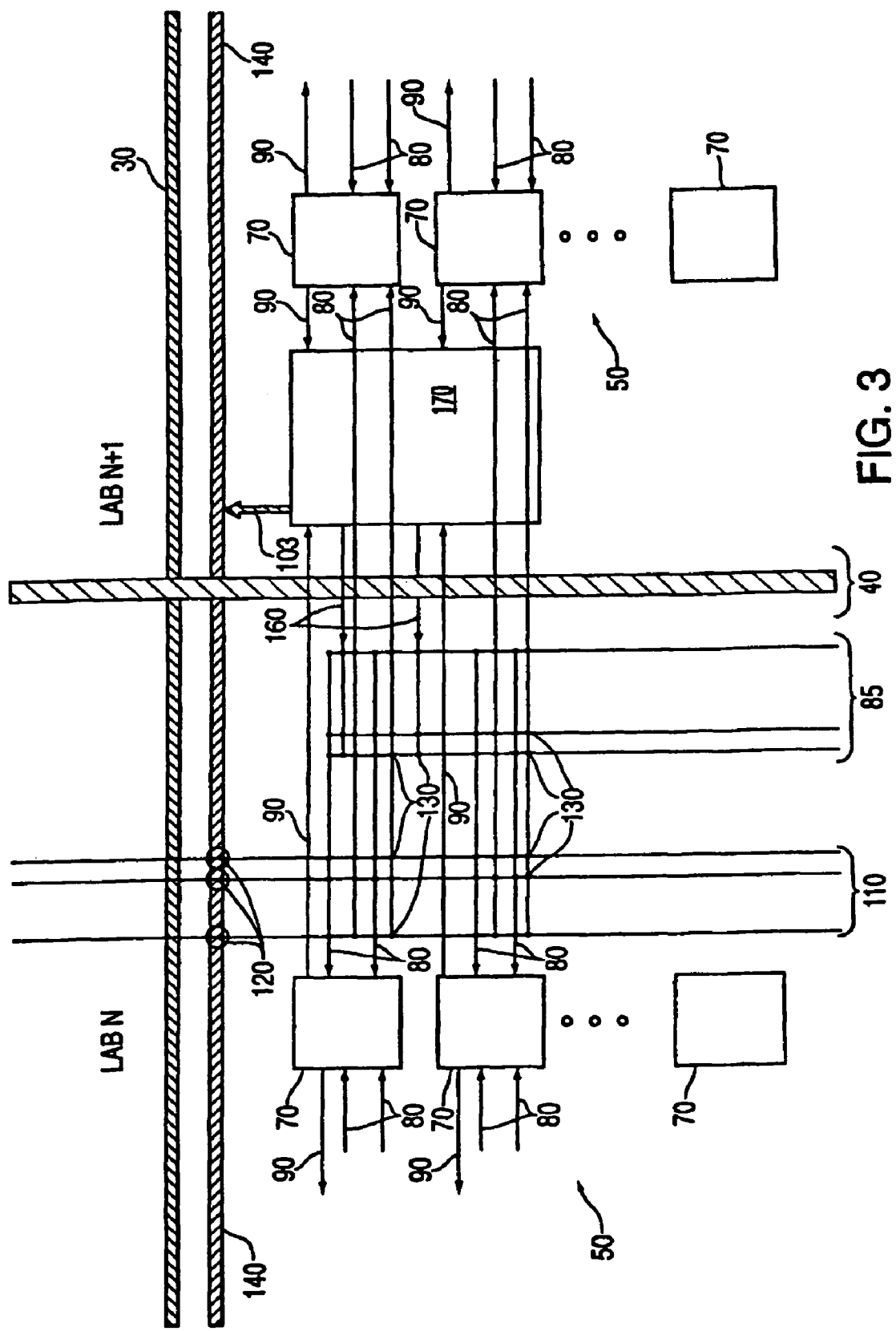

FIG. 3 shows portions of two LABs 50 (N and N+1). As mentioned in the preceding paragraph, LABs are interconnected within a GOL by global horizontal (GH) conductors 140. Each LAB includes ten programmable logic elements 70 for performing certain digital logic functions. Output conductors 90 are connected to a set of routing drivers 170 that route logic element output signals to V conductors 40, H conductors 30, GH conductors 140 (via conductors 103)

or local conductors 85 (via conductors 160). Routing drivers 170 are organized in the form of multiplexers and tristate drivers.

Each LAB includes a number of LAB-feeding conductors 110 to selectively bring signals from the GH conductors into the LAB. Programmable connections 120 programmably connect GH conductors to LAB-feeding conductors for this purpose. Programmable connections 130 allow the signals on LAB-feeding conductors 110 and local conductors 85 to be selectively applied to logic element inputs 80.

Figure 4:
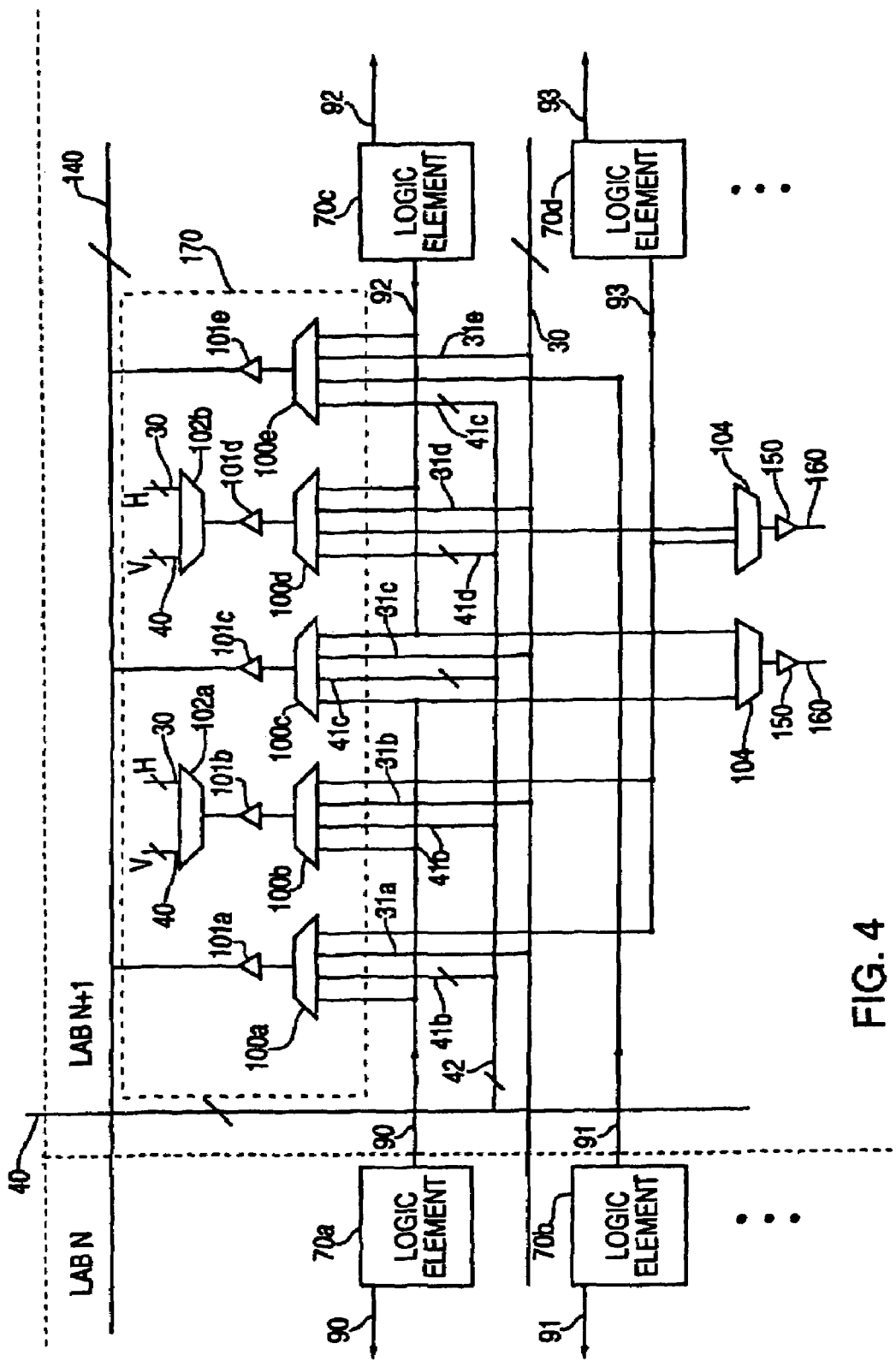

FIG. 4 shows routing drivers 170 in more detail. In particular, FIG. 4 shows a driver arrangement for interconnecting a GOL with the H, V, and GH conductors that are associated with that GOL. In APEX devices, H and V conductors can span the entire length of PLD 10 and provide interconnection among the various GOLs within the PLD (see FIG. 1). Each set of GH conductors spans the entire length of a particular GOL and provides interconnection among the various LABs and memory regions within that GOL.

The driver and multiplexer arrangement shown in FIG. 4 allows signals to be selectively routed among multiple conductor types. Each LAB has a set of associated H, V, and GH conductors. Signals from logic elements 70 are applied to multiple V, H, and GH conductors to provide each signal with a number of possible paths to each conductor type. This is accomplished by a set of programmable multiplexers, demultiplexers, and tristate buffers. As shown, signals from logic elements 70a-d, H conductors 30, and V conductors 40 are applied to certain inputs of multiplexers 100a-e. Multiplexers 100 select from among these input signals and allow the selected signals to pass as outputs to the appropriate conductors using tristate drivers such as GH drivers 101a, 101c and 101e or V/H drivers 101b and 101d. Although signals traveling on certain conductors are selected using multiplexer-type circuits, connections between two separate points are made by enabling the appropriate tristate driver to supply the selected signal.

One benefit of the interconnection scheme of FIG. 4 is that signals traveling on one type of conductor can readily shift or "turn" to another type of conductor to reach a desired destination using the driver-based scheme described above. For example, if it is desired to route a signal from a LAB in one GOL to another LAB in a GOL diagonally across PLD 10, the signal may be conveyed horizontally on an H conductor 30, then make an H to V turn in a routing driver and be conveyed on a V conductor 40 until it arrives at the desired GOL. The signal could then make a V to GH turn via another routing driver and be conveyed on a GH conductor 140 until it arrives at the desired LAB 50.

Figure 5:
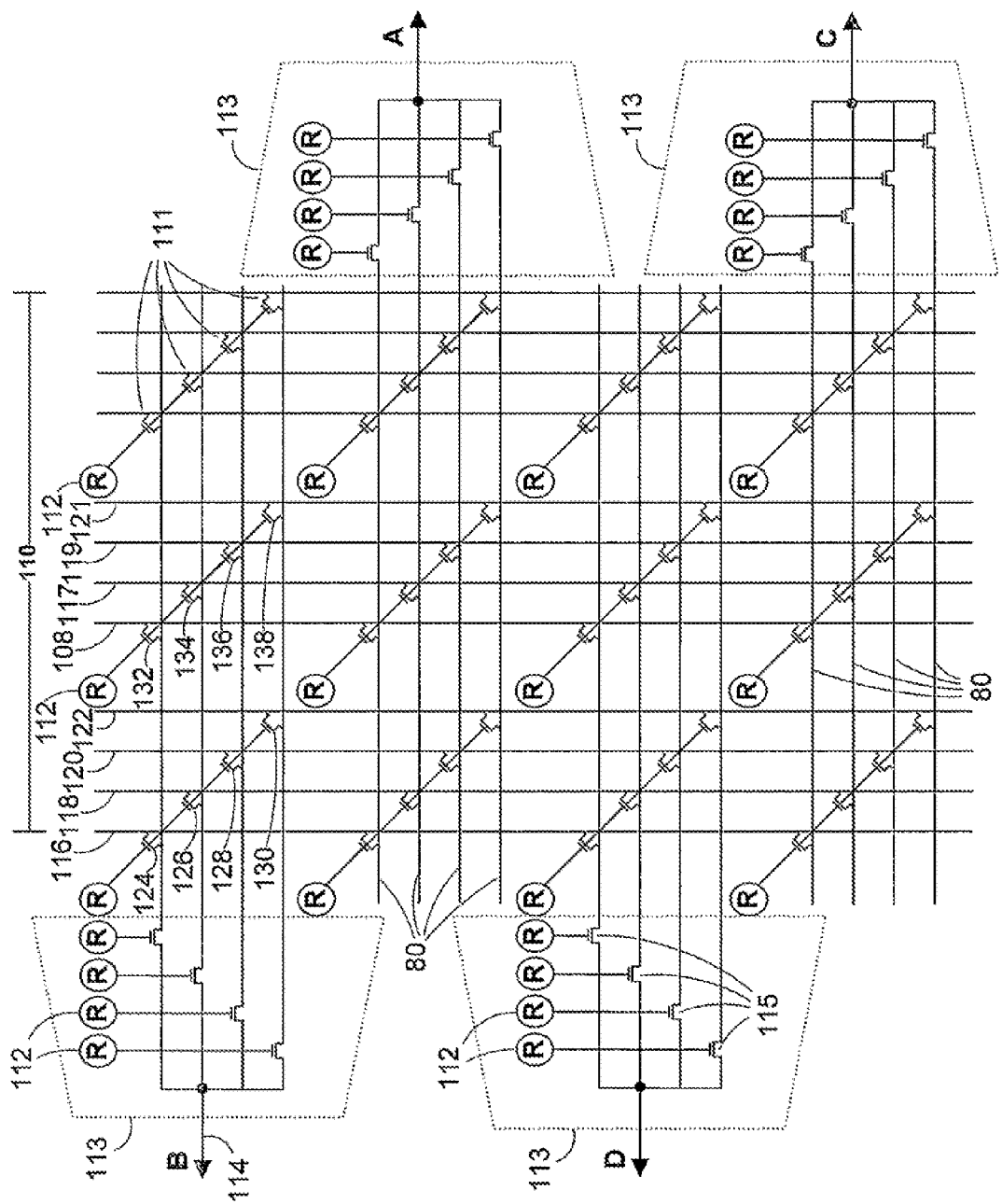

FIG. 5 shows the type of programmable logic connectors ("PLCs") and multiplexers that are employed to make programmable connections in APEX devices. The term "PLC" refers to circuitry of the type embraced by the bracket 110 in FIG. 5, and the term "multiplexer" refers to circuitry of the type surrounded by any of dotted lines 113 in FIG. 5 (multiplexers 113 shown in FIG. 5 are examples of one-hot multiplexers). FIG. 5 shows a typical case in which a signal traveling on one type of conductor is turned to a conductor of another type (e.g., vertical to horizontal) and passed through at least one multiplexer (and possibly a tristate buffer (not shown)) before reaching its ultimate destination. For example, in FIG. 5, a signal traveling on a vertically oriented conductor 110 may be turned to a horizontally oriented conductor 80 using a pass transistor 111. Each pass transistor 111 is situated such that the drain terminal is connected to a vertically oriented conductor 110 and the source terminal is connected to a horizontally oriented conductor 80 (or vice versa). A programming element[2] 112 is connected to the gate of one or more pass transistors 111 and may selectively provide a voltage sufficient to allow the pass transistor(s) to conduct. If desired, a signal traveling on a vertical conductor 110 may be turned to travel on a horizontal conductor 80 by turning ON a pass transistor and allowing the signal to pass from one conductor to another. Thus, the PLCs described herein typically include a pass transistor 111 and programming element 112. Additional transistors are not required to turn a signal from one type of conductor to another.

[2] A programming element refers to any suitable method or output used to hold the programming state of a device. This could include, but is not limited to SRAM (static random access memory), EPROM (erasable programmable read-only memory), EEPROM (electrically erasable programmable read-only memory), anti-fuse devices, laser programmed fuses, or metal programmed connections.

Also shown in FIG. 5 are multiplexers 113, which include pass transistors 115 and programming elements 112. In multiplexer 113, which is an example of 4:1 one-hot multiplexer, each programming element 112 is associated with only one pass transistor 115, which is connected to only one type of conductor (i.e., horizontal or vertical). One of the signals entering multiplexer 113 may pass through to output 114 by turning ON a certain pass transistor 115 with programming element 112. In such a configuration, the other pass transistors 115 in the multiplexer should preferably be OFF. This allows a signal traveling on the selected conductor to pass through the conducting transistor and on to output 114 and (except in the case of extremely local connections) an optional tristate buffer (not shown in FIG. 5). Using this pass transistor configuration, various signals may be routed to and from different parts of PLD 10. (As explained below, in the case where none of the inputs to MUX 113 are dynamic, and at least one of the inputs to the MUX 113 is tri-state, more than one of transistors 115 can be ON, effectively shorting together a driven line and a tri-state line.)

Figure 6:
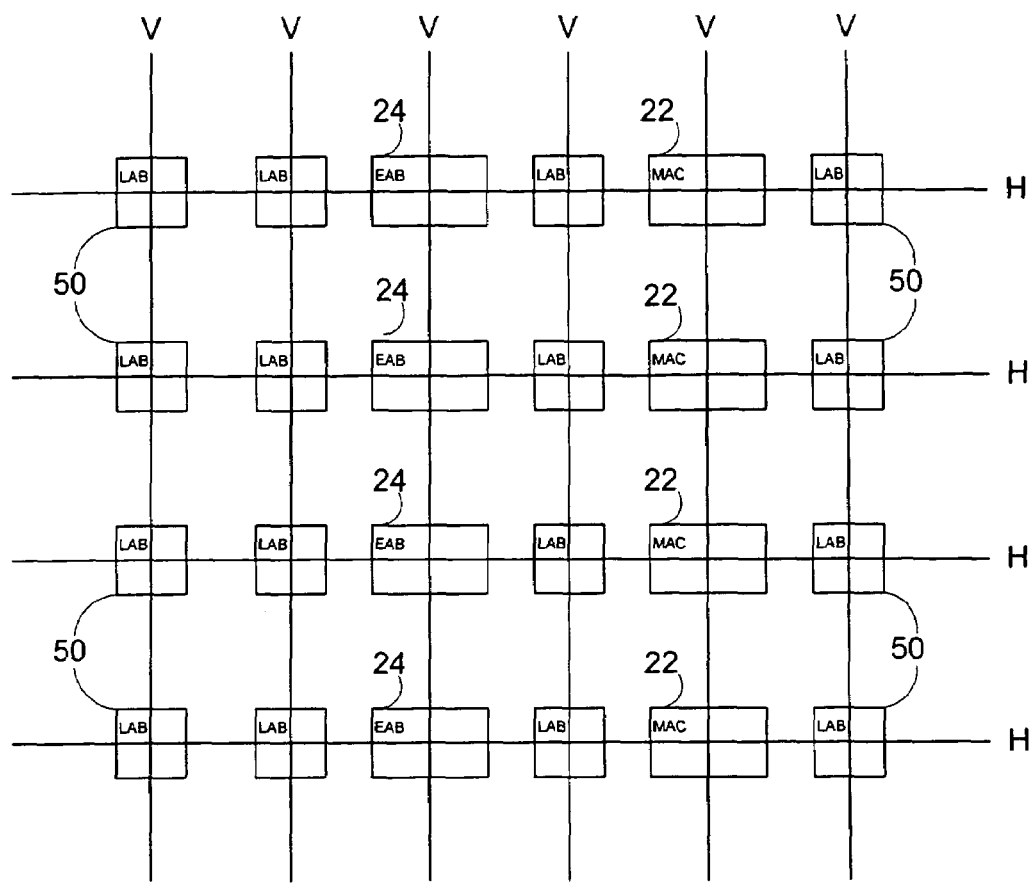

Like APEX devices, STRATIX devices are arranged in a two-dimensional array of rows and columns of processing circuitry (see FIG. 6). In STRATIX devices, however, the processing circuitry is interconnected by segmented variants of the H and V interconnection conductors used in APEX devices. This difference is described in more detail below. Another difference is the presence of configurable Multiply Accumulate processor blocks (MACs) in the STRATIX device. (For present purposes, the "EABs" in STRATIX are similar to the memory regions 51 in APEX but larger in size.) Multiply Accumulate processor blocks 22 and EAB memory regions 24 are interspersed between LABs 50 on the device die. STRATIX devices do not group processing blocks together to form the GOL regions found in APEX products. The additional circuitry in STRATIX devices helps provide an advanced digital signal processing (DSP) capability not found on APEX devices.

As mentioned above, interconnection between the various processing regions in a STRATIX device is accomplished using segmented V and H conductors. Six different types of segmented H and V conductors are used: in particular, H4, H8, and H24 conductors for making connections in the horizontal direction, and V4, V8, and V16 conductors for making connections in the vertical direction. The number following the letter H or V signifies the block length of each conductor segment. For example, an H4 conductor spans the distance of four processing blocks (i.e., LAB/MAC/EAB) in the horizontal direction, an H8 conductor spans eight processing blocks, etc. The same is true for V conductors in the vertical direction. H and V conductors can be interconnected or "stitched" together at various positions using multiplexers and tristate drivers to form conductors of greater length, if desired. For example, three H4 conductors may be interconnected to form an H conductor that spans twelve processing blocks, two V8 conductors could be connected to form a V conductor that spans sixteen processing blocks, or two H4 conductors could be stitched together at an intermediate point to form an H conductor that spans seven processing blocks, etc. This feature allows circuit designs on the STRATIX device to be more nearly optimized by creating only the minimum or closer to the minimum interconnection network required to implement a particular design.

Figure 7:
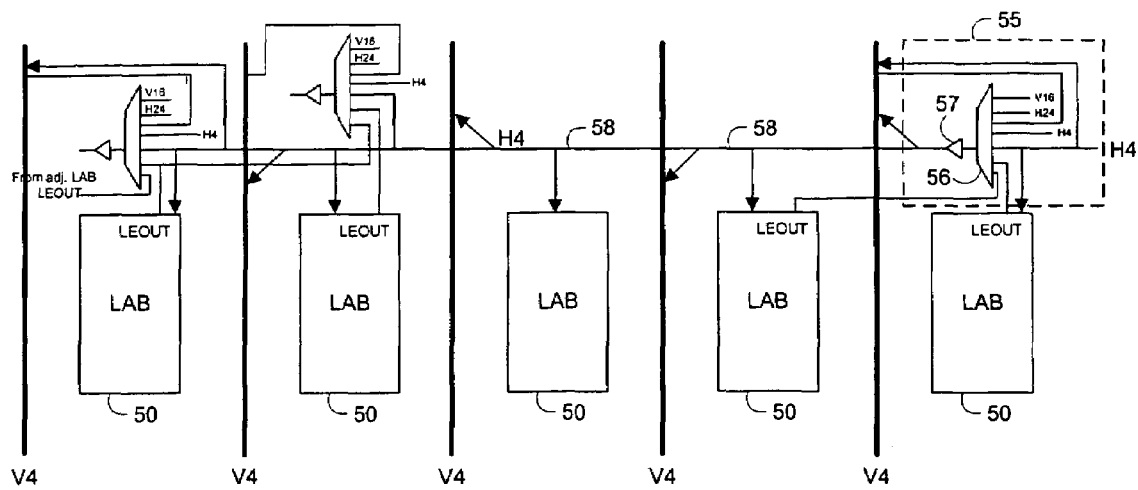

A representative routing driver 55 that is used in STRATIX to interconnect H conductors (and for other purposes) is shown in FIG. 7. FIG. 7 also shows how routing drivers 55 are used to interconnect the processing blocks associated with that routing driver. As shown, each routing driver 55 includes an H driver 57 and a multiplexer 56 (which is constructed like a multiplexer 113 in FIG. 5). Each multiplexer 56 has seven different inputs. From top to bottom, the first input is from a V16 conductor, the second input is from an H24 conductor, the third input is from an adjacent V4 conductor, the fourth input is from a parallel H4 conductor, the fifth input is from the H4 line being extended, the sixth input is from a LAB directly below, and the seventh input is from an adjacent LAB. Signals traveling on these conductors or entering from the nearby LABs may be selected by multiplexer 56 and connected to H4 conductor 58 using H driver 57 for routing to other portions of the device. In addition, signals traveling on conductor 58 may connect to other LABs or V4 conductors through the PLC-type connections depicted as diagonal and vertical arrows in FIG. 7 (implemented as shown under bracket 110 in FIG. 5).

Figure 8:
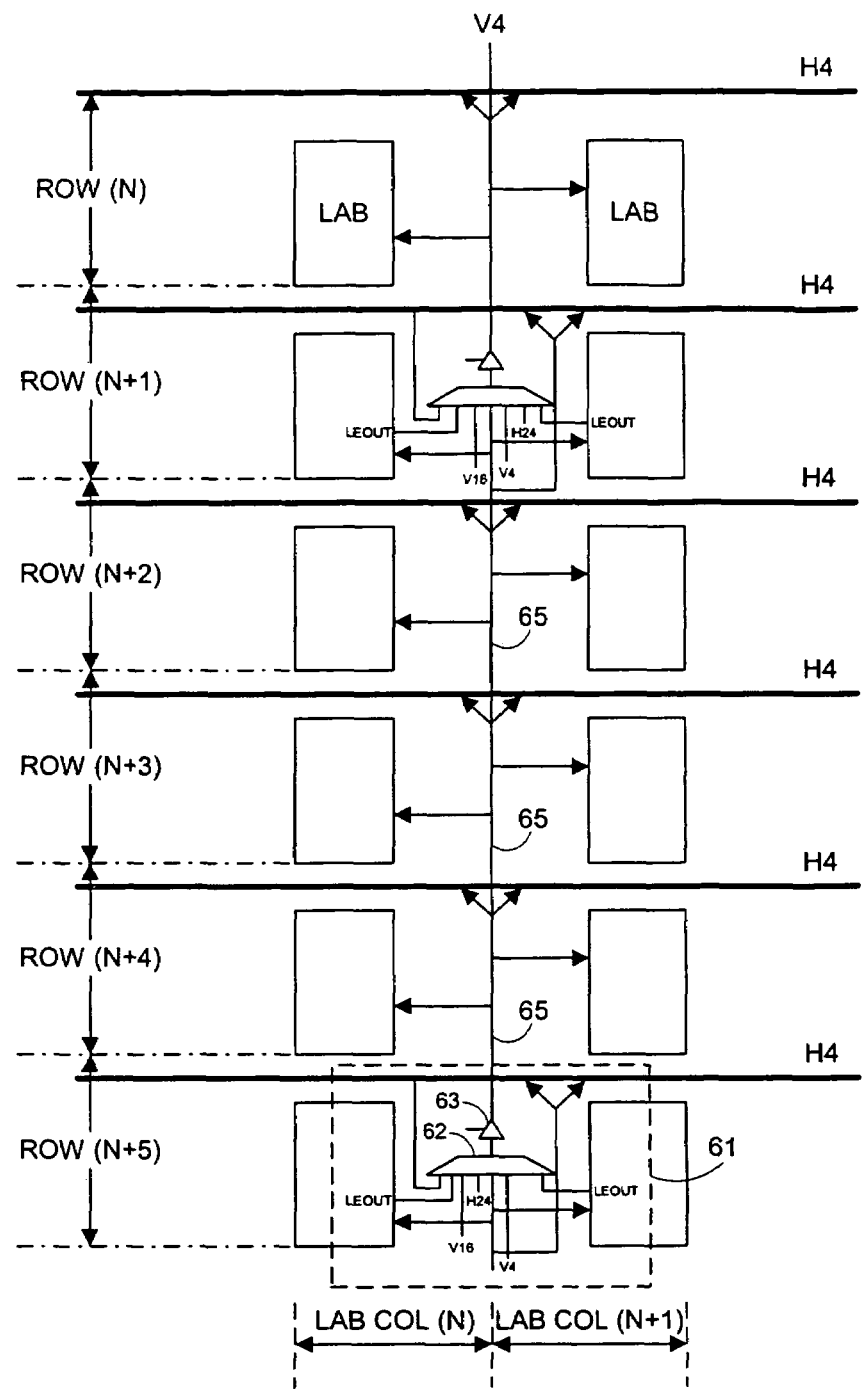

A similar scheme is employed in the vertical direction. This is shown in FIG. 8. As shown, each routing driver 61 includes a V driver 63 and a multiplexer 62 (which is constructed like a multiplexer 113 in FIG. 5). Each multiplexer 62 has seven different inputs. From left to right, the first input is from an H4 conductor, the second input is from an adjacent LAB to the left of multiplexer 61, the third input is from a V16 conductor, the fourth input is from an H24 conductor, the fifth input is from the V4 line being extended, the sixth input is from a parallel V4 conductor, and the seventh input is from an adjacent LAB to the right of multiplexer 61 (although this order may be changed in some routing drivers 61).

Signals traveling on these conductors or entering from the nearby LABs may be selected by multiplexer 61 and connected to V4 conductor 65 using V driver 63 for routing to other portions of the device. Moreover, signals traveling on conductor 65 may connect to other LABs or H4 conductors through the PLC-type connections depicted as diagonal and vertical arrows in FIG. 7 (implemented as shown under bracket 110 in FIG. 5).

Figure 9:
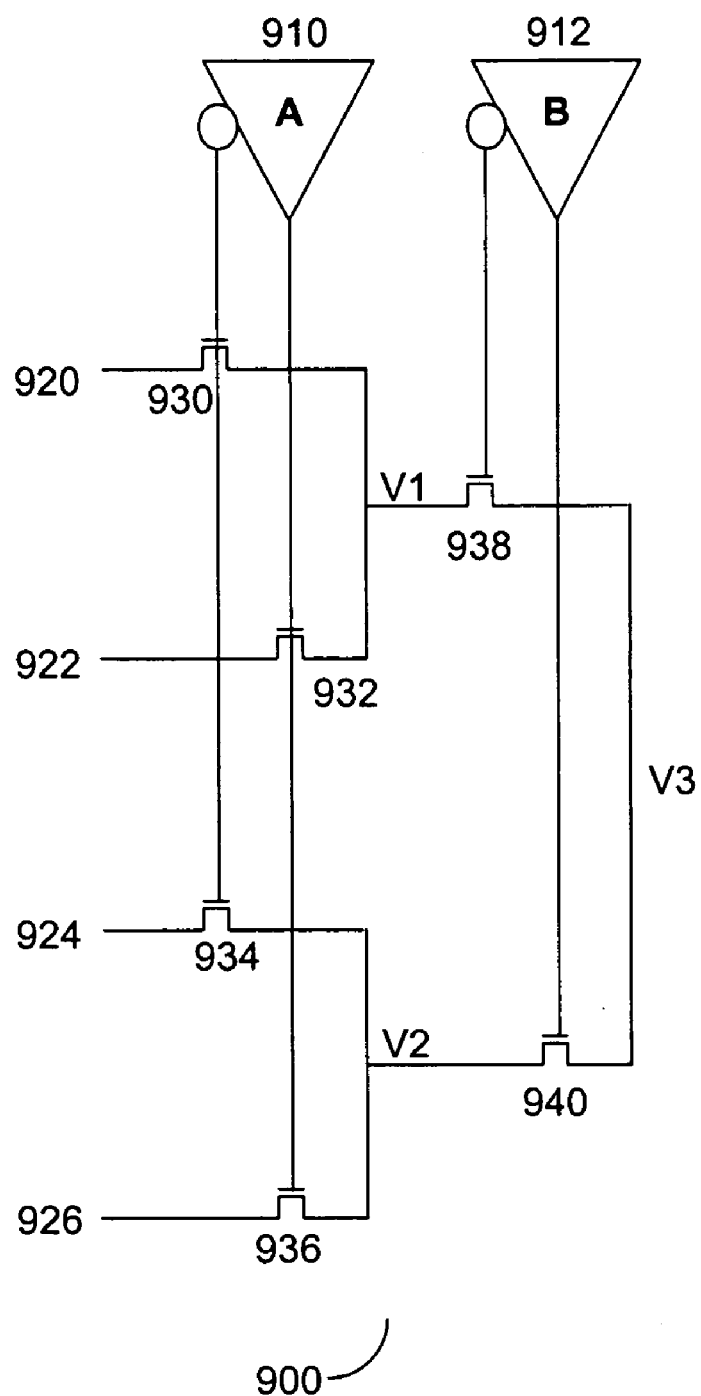

FIG. 9 shows a two-input look-up table (LUT) 900 that is also provided here for purposes of introduction to systems and methods according to the invention. LUT 900 preferably includes inputs 910 and 912 (which are also labeled as A and B in order to clarify examples described below in the application), storage locations 920, 922, 924, and 926 and pass transistors 930, 932, 934, 936, 938, and 940.

LUT 900 preferably operates as follows. The inputs receive a two-bit signal—i.e., 00, 01, 10, or 11. Then, in response to the two bit signal received at the input, the output of the LUT at V3 preferably provides an output signal selected from one of the storage locations.

In one particular embodiment of the invention, if input 910 is not used, then it can be assumed that input 910 is tied high to the VCC (or, alternatively, it can be tied to ground[3]). In that case, pass transistors 930 and 934 are OFF. Storage location 920 and storage location 924 are "don't care" bits because their stored value has no effect on the LUT output. The values associated with storage locations 920 and 924 can be set arbitrarily—i.e., either high or low. In order to reduce the leakage current in the LUT, it follows that the voltage differential between the respective sources and drains may be minimized by setting storage location 920 equal to storage location 922 and storage location 924 equal to storage location 926. Thus, there will preferably never be a voltage difference across any of transistors 930, 932, 934 and 936, and none of these transistors will leak.

[3] The state to which unused routing is pulled by the hardware or by a tie-off routing step should consider the gate leakage and subthreshold leakage implications of using either Vcc or Ground as a tie-off value. If most active signals are known to be more likely to be a logic '1' than a logic '0', then a Vcc tie-off can reduce sub-threshold leakage by ensuring no voltage difference across unused routing multiplexer pass transistors. If, on the other hand, gate leakage is known to be large in the process, it may be best to tie-off unused routing wires to ground so that there is no potential difference between the gate and drain of unused routing multiplexer pass transistors (See, e.g., transistors 115 in FIG. 5).

To obtain this result requires two conditions. First, the LUT should be synthesized whereby A is the unused input rather than B. If B is the unused input, then none of transistors can be guaranteed to be leak-free. And, second, the don't care bits should be set appropriately.

This concept can preferably be expanded to a LUT-n. If the function being implemented on the LUT-n is only a function of (n−1) variables or fewer, then the input(s) having the most transistors may always be selected to be the unused variable, and half or more of the LUT-mask (the LUT mask defines the values that are in the storage locations in the LUT) can be synthesized as don't care bits. In FIG. 9, the entire first stage—i.e., the stage corresponding to input 910—may be formed such that each of transistors 930, 932, 934 and 936 do not have a voltage differential across them for all operational states of the PLD.[4]

[4] In practical cases, a simulation of the different combinations may be required to determine which situation is better; a simplistic goal of moving as many inputs to the area associated with the greatest number of pass transistors may not be sufficient.

This solution may provide widespread power saving. In fact, it is estimated that in a typical PLD, approximately half of the LUTS that are used do not utilize at least one input. Based at least in part on this principle, configurations and methods may be implemented in order to reduce leakage current and, thereby, reduce static and total power consumption of a PLD according to the invention.

Another area in which power-saving principles may be implemented includes the synthesis of wires, the placing of wires and the development of routing schemes of signals along the wires, in a PLD. The majority of routing wires in a typical PLD are not used. In fact, it has been estimated from user data that for some architectures, on average, only 20%–25% of routing wires are used for a typical design. Moreover, it has been asserted that the maximum number of wires that can be used is limited to about 60% before a design becomes unroutable. By implementing appropriate bias toward grouping of unused wires during the routing stage, leakage current may be reduced by, again, maximizing the number of FETs that have the same voltage on both the drain an the source. This reduction of leakage current may be particularly true in PLDs in which the unused lines typically float to VCC (or, alternatively, to ground). Preferably, systems and methods according to the invention direct the CAD systems to select, where appropriate, the lowest power group of wires from the many wires that are available in the PLD.

Other concepts relating to power-saving with respect to sorting are also involved in the invention. The following are guidelines for items that should be taken into account when implementing power-saving concepts with respect to the placing of wires and routing of signals in a PLD. The importance of the power-saving concepts should be prioritized appropriately versus other goals including routability, CAD run time, and speed. The different techniques presented should also be prioritized against each other based on the relative power savings achieved by each technique for the given circuit. This prioritization may be done by parameterizing the cost function associated with the power-saving concepts appropriately with respect to the routability, CAD run time, and speed.

These configurations and methods—i.e., power saving improvements to technology mapping and routing of signals—may preferably be implemented using the CAD systems or other software that determines the programming for the PLD. Typically, there is one system that takes the user's design and determines how to implement it in a PLD. There is then a separate piece of software that takes the results of the first program and does the actual programming of the bit-stream into the PLD. All of this software is typically used to program the PLD to carry out the desired logic functions. This software may be used for the synthesis and placement of wires as well as the routing of signals. It should be noted that, except where specified, the configurations and methods described herein, and the rules associated therewith, may preferably be carried out independently of one another and in any desired sequence with respect to one another.

A first method by which to reduce dynamic and leaked power may be related to routing signals along certain relatively low power wires. For example, GH conductors, such as GH conductors 140 in FIG. 3, which span the entire PLD may be faster than others. Additionally, it may be that some GH lines are faster than other GH lines of the same length because of different spacing and different size driving transistors. In addition, some GH lines may be faster than other different length routing wires. These faster wires are typically used to speed up time-critical paths. These faster wires typically use larger transistors and lead to higher leakage current. In addition, these wires typically have more capacitance, and therefore require more power to toggle (an example of dynamic power). When possible, these wires should be avoided in order to reduce the leakage current of transistors associated with these wires. More specifically, it should be noted that longer or "global" wires, such as the GH conductors 140 in FIG. 3 typically consume more power than relatively shorter wires such as H conductor 30 or local conductors 85 (see FIG. 3). Also, wider wires, which conduct signals more quickly, typically have more capacitance than thinner wires, which conduct signals more slowly.

Another example of concepts relating to power saving in PLDs relates to the relative leakage of N versus P devices. For a given silicon-chip based electronic device, such as a PLD, an inverting or a non-inverting buffer may be chosen as a buffering device (such as drivers 101*a-e* shown in FIG. 4). In methods according to the invention, a simulation may preferably be performed that determines the power cost of the buffer, and preferentially biases the results to have the buffer driven by a 0 or a 1 as will be explained in the following paragraph.

An inverter is typically built with one N device and one P device. When the inverter is driven by a 1, the P device is turned OFF, and thus is leaking power, and when the inverter is driven by a 0, the N device is turned OFF, and thus leaking power. Depending on the process and implementation, either the N or P leaks more power than the other; thus there is a preference of driving a 0 or 1 with respect to power saving. In the case of a non-inverting buffer, there is typically two inverting buffers combined. The second one typically uses much larger transistors and therefore has a larger effect on the total power leaked. Then, based on the simulation, the circuit may be synthesized, placed and signals routed in a lower power fashion. This technique applies both to unused logic cells which can be set to drive a constant 0 or 1, as well as active logic cells in such cases that via a simulation or other estimation, the cell is known to be predominantly in either the 1 or 0 state. If the cell does not drive a register, it may be possible to drive the inverse of the function, while adapting to the results of the inversion in the destination cell, and reduce power by taking into account the above-described technique.

Figure 10:
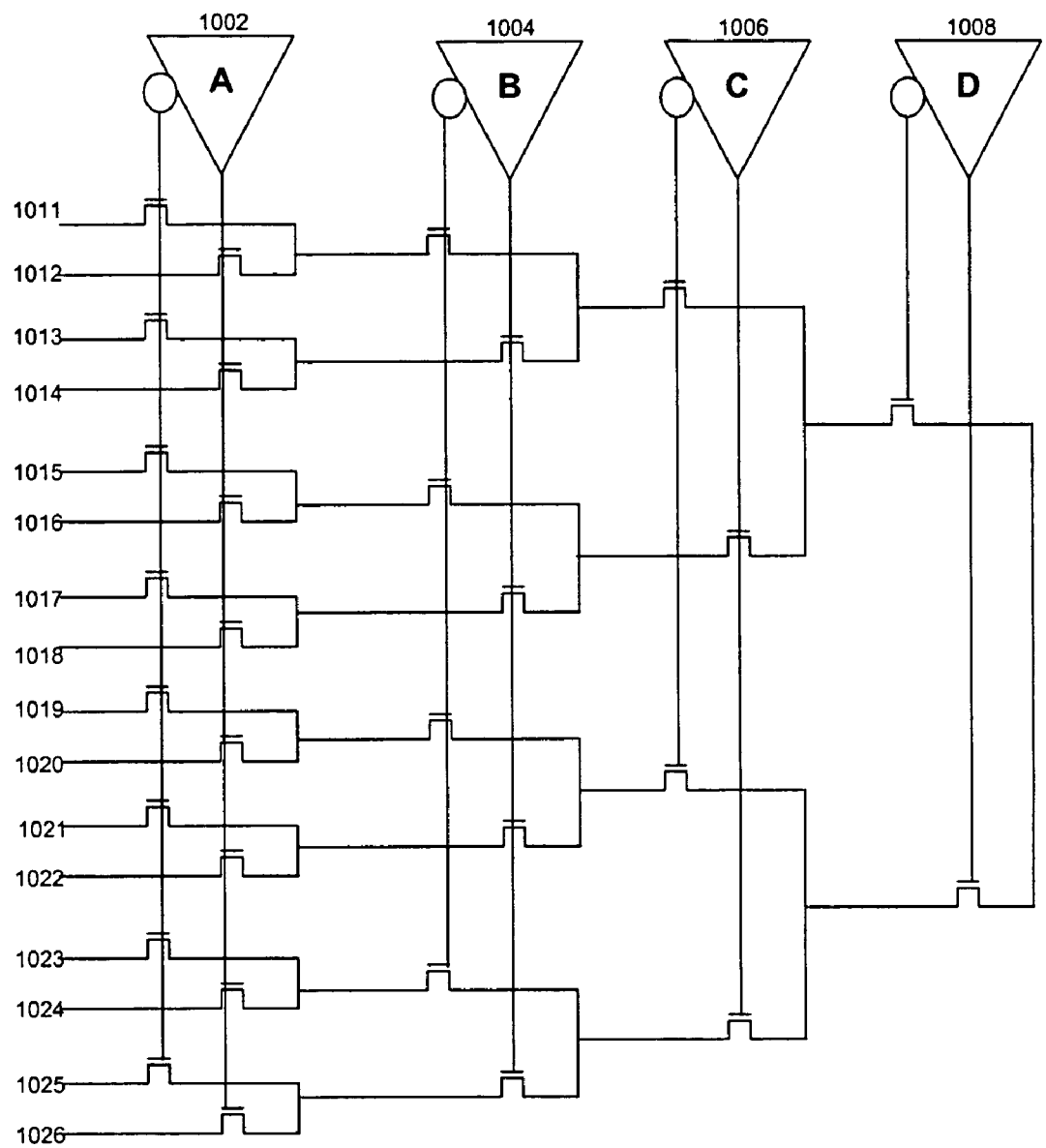

To further illustrate concepts described below, FIG. 10 shows certain aspects of LUT 1000 which may preferably be formed in LE 70 (it should be noted that the LUT may be a four-input LUT, a six-input LUT, a seven-input or any other LUT having a suitable number of inputs). LUT 1000 may include inputs 1002, 1004, 1006 and 1008, storage locations 1011-1026, and pass transistors: 16 pass transistors are associated with input 1002, 8 pass transistors are associated with input 1004, 4 pass transistors are associated with input 1006 and two pass transistors are associated with input 1008. Element numbers and lead lines for the pass transistors have not been included in FIG. 10 in order to maintain the clarity of the figure.

In another rule that may be implemented according to the invention, in the case of an unused logic element in a PLD, it may be advantageous, where conflicting considerations do not dictate to the contrary, to set all bits, such as the bits that are carried from LEs 70*a-d* on routing lines 90-93, to minimize static power. In one particular embodiment of this rule, it may be determined whether, if the output of the logic element drives a suitable circuit, the output being carried on routing lines 90-93, a 0 or a 1 is more useful as a potential output value with respect to power consumption to drive the unused routing lines 90-93 that flow from the logic element.

This may be illustrated, for example, in FIG. 5. Specifically, FIG. 5 includes the first four wires of group 110, which are identified as 116, 118, 120 and 122. If transistor 124 is ON, thus conducting a signal on line 116 to its respective wire, then it is also true that signals conducted along lines 118/120/122 will also be conducted because transistors 126/128/130 will be ON as well. If line 116 is known to have a signal that is a 0 the majority of the time, and line 108 is not used, then it is preferable to have line 108 be driven by a 0 so as to minimize the leakage across 132.[5] Alternatively, if dynamic power considerations and routing considerations allow, line 108 can be driven by the same signal as line 116, thus substantially guaranteeing that at all times no voltage difference exists across 132. As another variation, line 108 can be driven by a different active signal that is also know to be 0 the majority of the time, or known to be highly correlated to the state of line 116 so as to maximize the time that there is not a voltage difference across 132. Similarly, it becomes beneficial to consider the relationship between wires 118 and 117, 120 and 119, and 122 and 121. Even though, in this particular example, these wires are not used for routing (only 116 is being routed), the shared configuration turns on transistors 124/126/128/130, thus there is potential leakage across transistors 132/134/136/138. It should be noted that, in order to avoid the potential leakage across transistors 132/134/136/138, an additional step of finding and routing signals into lines 108/117/119/121 that limits leakage across transistors 132/134/136/138 may be required.

[5] By symmetry, if the signal on line 116 has a 1 the majority of the time, then it is preferable to have line 108 be driven by a 1.

In certain cases a routing wire coupled to the output of such a non-used logic element may feed a number of other elements that are in use or, at the least, may have other requirements with respect to the signals that are driven thereon. Therefore, the signals driven from the unused logic element should preferably take into account the other constraints of the circuit.

One known configuration for implementing a multiplexer in programmable logic is to use two four-input look-up tables (such as LUT 1000) in order to create a four-to-one multiplexer (i.e., a multiplexer where N=4). A typical 4:1 MUX in a PLD may be in a four-input LUT using 2 control inputs and 4 data inputs, whereby one of the two control inputs may be used for receiving a signal from a first MUX. Alternatively, a one-hot encoding may be implemented to create each of the component MUXes of a four-input MUX. Such a configuration preferably assumes additional capability of the LUT such as an AND-cascade. This is because, in a one-hot encoding, all the inputs of the LUT have been used for data and control, and no input is left for the first LUT to communicate its result to the second LUT.

In another PLD architecture, an N:1 one-hot mux—e.g., an 8:1 mux—may be implemented as two N/K:1 one-hot muxes (as in FIG. 5 with the mux based on elements 111 and 112 feeding the one-hot mux 113)—e.g., two 4:1 muxes which feed a 2:1 mux. In suitable circuitry, the two 4:1 muxes may be implemented using common RAM bits. The multiple effects with respect to power consumption—e.g., reducing leakage of the transistors controlled by the common RAM bits on multiple muxes should be taken into account when determining a routing scheme for such a configuration.

Moreover, in a typical 8:1 one-hot mux, or any other suitable mux, certain of the inputs may have a particular behavior—i.e., one of the inputs may be toggling while others are not. In this situation, the entire mux must be powered, and therefore all the associated transistors leak power, even though the other seven inputs are disabled. It may be advantageous to try to minimize the occurrence of such situations—i.e., minimize "one of eight" usage—while maximizing other types of situations—i.e., "none of eight" in which the one-hot mux is powered down—where possible within the constraints of the circuit.

Another aspect of the invention relates to optimizing routing with respect to the logic of a PLD. As described in the portion of the specification corresponding to FIG. 4, a PLD typically includes an array of LEs (see elements 70a-d in FIG. 3), wherein each logic element may include a lookup-table, feeding a register. These LEs are typically grouped together in groups of eight (or other suitable number) in a LAB (see FIGS. 3, 6, 7, and 8) that contains routing resources for applying signals to the inputs of the LUTs of the LEs contained in that LAB and routing resources for receiving the output signals from the registers of the LEs and driving the output signals onto other signal lines (see FIG. 4). A PLD may also have programmable resources for routing the outputs of LEs from and between the LABs. A PLD will typically contain 10,000-100,000 LEs but may contain less than 200 or even more than 100,000 LEs.

The static power requirements for two partially populated LABs are likely to be higher relative to the static power requirement for a single, highly populated LAB. This fact is true because, as soon as some resources in a LAB are used, a number of wires that are indirectly connected to the wires in use become a static power drain. This can be better understood from an inspection of FIG. 4, which shows a portion of a LAB and the complex routing circuitry associated therewith and an inspection of the routing circuitry shown in FIG. 5. Simply put, reducing the number of active LABs reduces the number of wires and corresponding transistors used by the PLD. Thus, systems and methods according to the invention preferably minimize the number of LABs in use in the PLD, where applicable.

Similarly, an advantage according to the invention is obtained in reducing the number of LABs that use no registers in order to reduce the power associated with providing control signals for the registers in the LAB. Reducing the number of LABs that include active registers also reduces the number of wires and corresponding transistors used by the PLD.

In conclusion, a fully populated LAB may preferably consume less power than two partially populated LABs. This situation typically occurs because the two partially populated LABs have shared signals that, by definition, require a higher fanout (resulting in greater power consumption) because the signals are transmitted to two, instead of one, LAB. Furthermore, a LAB that includes active registers may consume more power than a LAB that does not include active registers. Thus, it may be more advantageous from a power standpoint to segregate all functions that require registers into one LAB and all functions that do not require registers into a second LAB, thereby reducing the power consumption of the non-register utilizing LAB.

On a higher level of architecture, it may be possible to power-down a portion of the PLD if that portion is unused. The granularity of the power-down according to the invention may be PLD specific. The PLD may preferably statically determine the granularity available. A specific design combined with directed placement would than take advantage of whatever granularity exists in the PLD. Routing of signals and placement and utilization of wires and LEs should maximize the percentage of the chip that is powered down. Nevertheless, a calculus may have to be performed to determine whether a reduction of the number of LABs that are being used, a minimization of LABs that use registers, shutting down a portion of the chip or some other technique such as shutting down individual LEs provides the most power saving because these techniques may themselves dictate different routing schemes.

With respect to dynamic power reduction techniques—i.e., the additional power consumed by operation above that of static power, the dynamic power being substantially linear in frequency, the total power being the static power plus the dynamic power—some architectures may include portions of the design where the state of the logic is a "don't care" during standby mode. For example, the internal state of a Floating Point Unit (FPU)—i.e., an arithmetic logic unit in a PLD that performs floating point calculations—may be a don't care when no calculations are being actively calculated. With respect to architectures that employ such units, it may be possible to partially power-down regions of the PLD such that the configuration of the circuit is remembered, but the state of the user logic is not remembered during the stand-by mode. Therefore, routing and placement should take into account which portion of a user's circuit is active and which may be inactive during a stand-by state.

Essentially, there may be a stand-by state for a particular sub-circuit. In fact, multiple, independent, stand-by states, each of which having a circuit that is located in an independent portion of the PLD could be dynamically powered-down as heretofore described. Furthermore, the routing and placement should maximize the number of regions that may be partially powered-down by appropriate placement. In one embodiment of the invention, the device that may be put on stand-by is a router and the stand-by mode is implemented when the router is not receiving data. Furthermore, in an embodiment of the invention the portions of the device that are powered-down (or, alternatively referred to herein as "turned OFF") relate to an internal logic state of the router and the portions that are not turned OFF may related to the configuration of the router.

In one embodiment of the above-described selectively-powering down power reduction technique, the PLD may preferably build into the chip itself the ability to power down a region. Software for programming such a chip may preferably be programmed to selectively power-down and power-up the portions of the chip as required by the operation of the circuit.

The ability of the PLD to selectively power-down and power-up portions of the PLD should preferably form a portion of the expected static power determination. The estimated static power should be combined with the estimated dynamic power using an appropriate metric to determine the total power consumption of the PLD. In some applications, static power is more important than total power, and therefore the power determination should preferably weight the static power accordingly. In other applications, total power is more important than static power, and therefore the power determination should preferably weight the total power accordingly.

On a transistor level, reverse biasing of the well of some transistors may be used to reduce the stand-by current of some transistors in return for lower performance. Depending on the architecture, which transistors are reverse biased may be statically chosen for the architecture, or chosen by the CAD tools on a design-by-design basis. In the latter case, it is likely that the transistors may be arranged in banks such that an entire group may be put in a high power or low power mode. For some designs, it may be that particular transistors should run at two different speeds. For example, particular transistors may need to operate in a monitoring mode most of the time and in an operation mode other times. In this case, an architecture may allow for dynamic run-time control for the reverse bias of the transistors on a region by region basis. In this way, the place-and-route tools should ensure that the design can meet the high performance requirements under high power and the lower performance requirements under the power-saving reverse bias state.

Synthesis, placement, and routing should preferably take into account maximizing the number of transistors that can be placed in the reversed bias, low-power, mode. One way to allow for this to occur is to over-compensate for the timing requirements of the circuit by enough to allow meeting performance specifications with few or no transistors being set to their high-speed, high-power state. Thus, the requirements on the transistor level may be reduced, and the basic timing goals may still be achieved. This technique may be used to reduce the number of high-speed high-power transistors operating in the circuit. In summation, reverse-biasing can occur in at least three ways: statically per PLD region, via programming element per region, or dynamically via a user controlled signal or pin.

Alternatively, the transistors can be designed for lower power, and then forward biasing can be used to selectively give higher speed only to those transistors that need the performance in return for higher power.

Yet another technique for reducing power consumption in a PLD relates to reducing power consumed by clock resources. In typical PLDs, several different types of dedicated clocking resources are available. Some clocking resources span the entire PLD (known under certain circumstances as "global clocks"), while others span only a portion of the PLD (known under certain circumstances as "regional clocks" and "fast regional clocks"). A placement and routing tool according to the invention can optimize power by biasing the placement of logic and registers such that the smallest or otherwise lowest power clocking resource can then be chosen. The priority chosen on this with respect to clock domain should be proportional to the clock frequency which in turn is proportional to the dynamic power that will be consumed by the clock network. Generally, the clocking resource with the most limited scope—i.e., the smallest portion of the chip—has the smallest switching power. In such a circuit, the placement and routing tool preferably selects regional and fast regional clocks, where applicable, in such a way that a "legal" placement—i.e., a placement that meets the user performance targets—is achievable. Additionally, the tool should attempt to place the highest frequency clocks on the clocking resources with the smallest switching power.

With respect to another embodiment of the invention relating to clocking techniques, it should also be noted that a clocking scheme is typically formed into a global network or clock tree that branches out over the PLD. The global network may be divided into quadrants or other finer grained regions. Techniques according to the invention should preferably eliminate, where possible, quadrants or other suitable portions of the clocking network that provide clock signals to logic regions not used by the design. Thus, in many PLDs, it may be advantageous for the routing and placement tool to attempt to localize the destinations of a clock network to certain clock tree branches so that some branches of the clock network drive no destinations and can be permanently powered down.

Another technique for reducing power consumption of a PLD relates to placement, routing, and technology mapping. A router or other down-stream module that typically is used for optimizing the routing scheme after the design is substantially set forth in the PLD often rotates, or rearranges, the inputs of LUTs used in the design in the PLD. In such cases, the down-stream module should take into account the power optimization effect of which LUT input is used for each signal according to the rules and biases set forth above with respect to synthesis, placement, routing and technology mapping.

Figure 11:
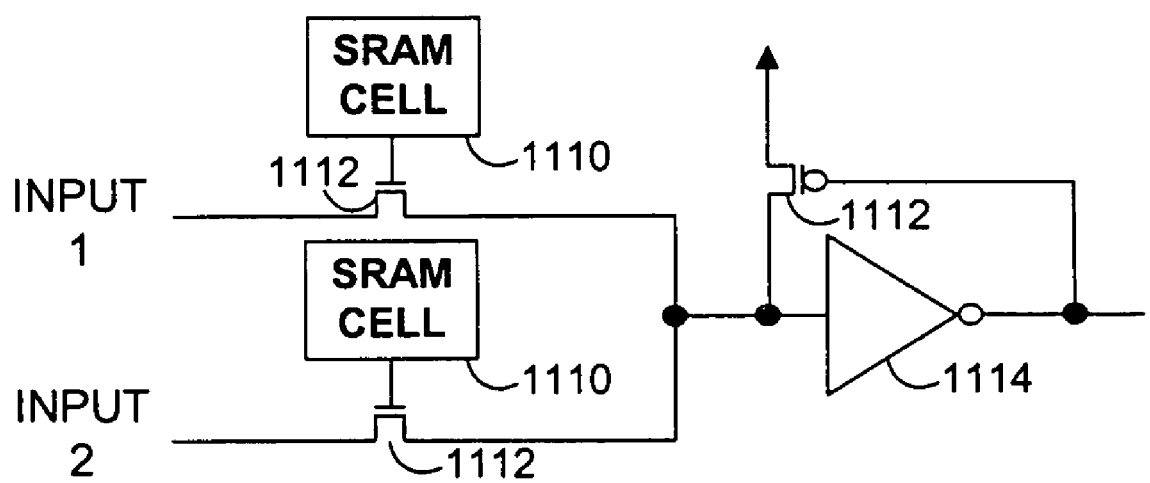
Figure 12:
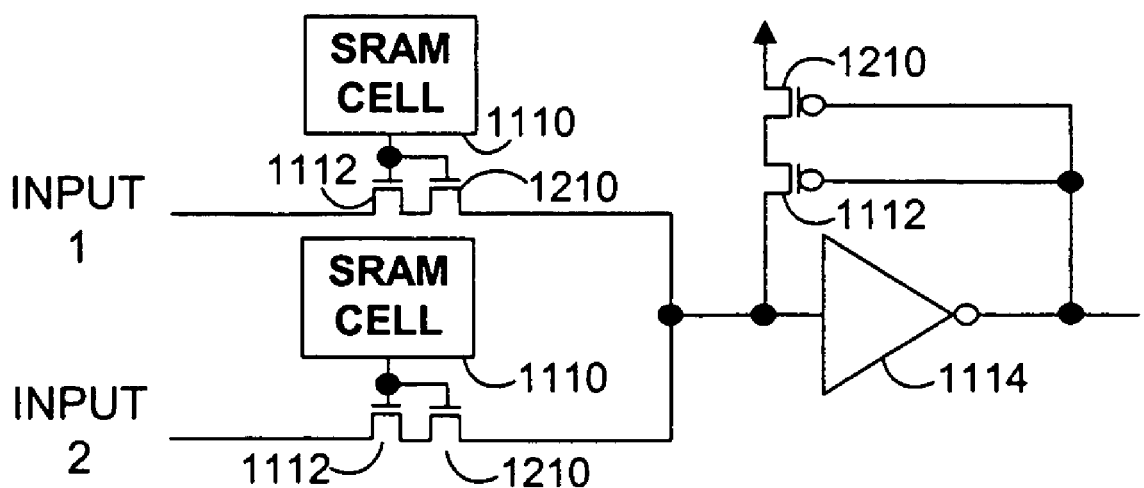
FIG. 12 is a schematic diagram of a portion of a multiplexer circuit according to the invention.

Yet another technique for reducing power in a PLD relates to architecture involving redundant transistors. Architecture according to the invention may include redundant transistors to enable more effective leakage control by turning OFF multiple transistors in a stack—i.e., where the transistors are aligned in series. FIG. 11 shows a conventional routing multiplexer 1105 including SRAM cells 1110, transistors 1112, and inverting buffer 1114. FIG. 12 shows the structure of FIG. 11 modified by the addition of redundant transistors 1210 in series. The routing multiplexer 1205 in FIG. 12 preferably has approximately 10× less leakage than the routing multiplexer in FIG. 11 because the worst-case leakage path is always through two OFF transistors instead of one.

Along the same line, when possible, the PLD, preferably using the assembler, should turn OFF multiple transistors in a transistor stack by setting all the appropriate CRAM bits to the "OFF" control state to further reduce leakage. For functionality, turning OFF one transistor in the stack is often sufficient to ensure that the output has the appropriate value. Nevertheless, for leakage purposes, as described above, it may be beneficial to turn more stacked transistors OFF whenever possible (it would also be beneficial to maintain stacked transistors in an OFF state whether or not those transistors form part of the design implemented in the PLD). The architecture may choose to provide stacked transistors in various buffers and multiplexers in order to ensure the assembler can often or always find two or more transistors in series to turn OFF.

It should be noted that with respect to such a technique, there may be a speed and area penalty associated with using redundant transistors in this way. The speed penalty can be reduced by making only some paths through the routing multiplexer use redundant transistors, and using no redundant transistors on other paths so that some routing paths remain fast, and can be used by the PLD routing CAD tool to rout speed critical signals as necessary. Similarly, redundant transistors can be used in the enable path of tri-state buffers, and other circuit elements.

In still another aspect of the invention, a heterogeneous routing resource pool, in which areas of low-power routing and areas of high-power routing are designated, may also be used to save power. From this pool, a CAD tool may utilize areas of routing for a specific design or for portions of a specific design while taking into account the power consumption of each of the areas, along with other considerations as described herein, including but not limited to speed and die area of the programmable logic device. The routing pool may include three or more gradations of low, medium, and high power routing resources. Alternatively, the logic cells themselves may have a heterogeneous power profile which allows for further selection and use of logic cells.

In general, the above techniques should preferably be balanced against any trade-off in speed and routability—i.e., the relative costs associated with a complex routing scheme that takes power into account as opposed to a scheme that does not take power consumption into account. For example, if the low-power routing schemes described above conflict with achieving the timing specifications required by the design as specified by the user, the appropriate choice should be made depending on the design priority for speed or low power. Also, the techniques should be balanced against each other proportional to the power benefit that each one derives.

FIGS. 13-19 show a series of high-level flow charts that illustrate select embodiments of methods, preferably used in PLD implementation software, according to the invention.

Figure 13:
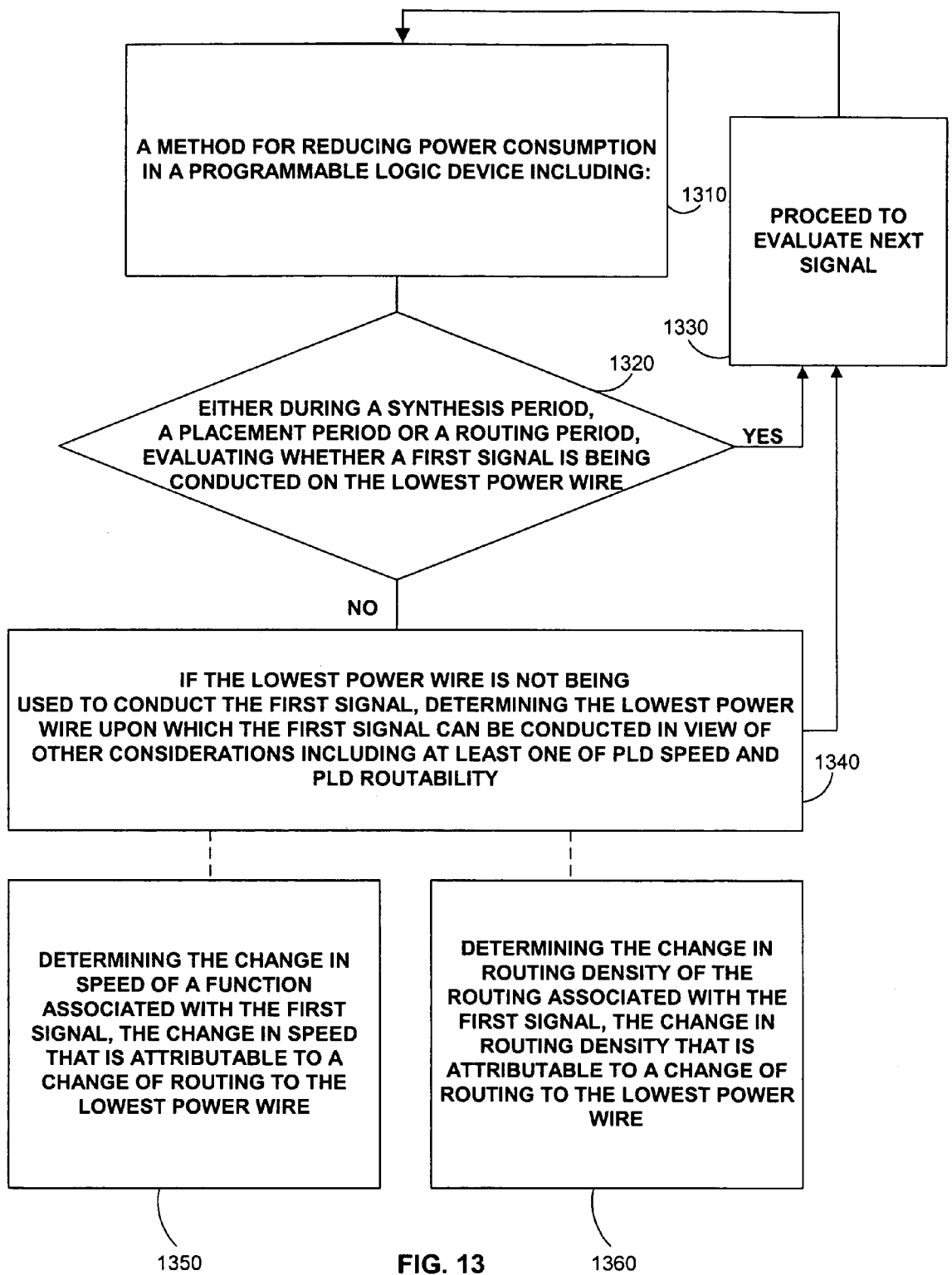
FIGS. 13-19 are flow diagrams that shows various methods according to the invention.

FIG. 13 shows a method for reducing power consumption in a programmable logic device in step 1310. Step 1320 shows that the method is preferably implemented either during a synthesis period, a placement period or a routing period, and that the method is for evaluating whether a first signal is being conducted on the lowest available power wire. Step 1330 shows proceeding to evaluating the next signal if the first signal is being conducted on the lowest available power wire. Step 1340 shows if the lowest power wire is not being used to conduct the first signal, determining the lowest power wire upon which the first signal can be conducted in view of other considerations including at least one of PLD speed and PLD routability for the PLD being evaluated. Step 1350 shows determining the change in speed of a function associated with the first signal, the change in speed being attributable to a change of routing to the lowest power wire. Step 1360 shows determining the change in routing density of the routing associated with the first signal, the change in routing density being attributable to a change of routing to the lowest power wire.

In one embodiment of the invention illustrated in FIG. 13, signals which are expected to have the highest switching speed should be biased toward routing wires during placement and routing that have the lowest capacitive load. It should be noted that normally the routing wires with the lowest capacitive load would be reserved for the signals on the critical path—i.e. the path that has the strictest timing requirement.[6] Nevertheless, in order to conserve power, it may be advantageous to have the circuit implement this idea even if the signals may not be routed on the critical path.

[6] The critical path refers to the portion of the design that is most critical to meet the user's timing requirement. For example, if portion "A" of a circuit needs to run at 100 Mhz and is currently running at 101 Mhz, and portion "B" of the circuit needs to run at 200 Mhz and is currently running at 250 MHZ, then portion "A" is the critical path since it is closest to not meeting its timing requirement.

Figure 14:
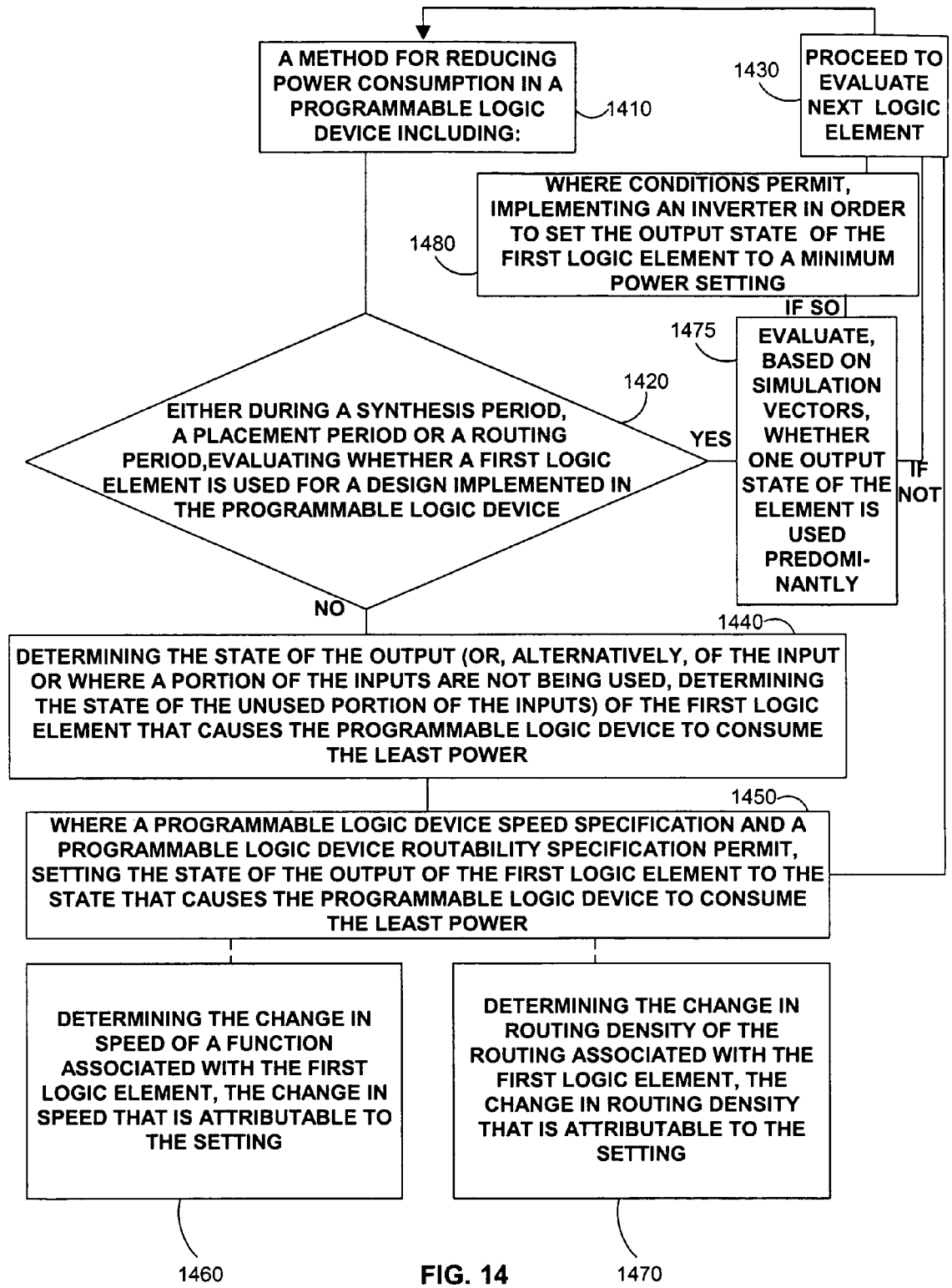
Figure 15:
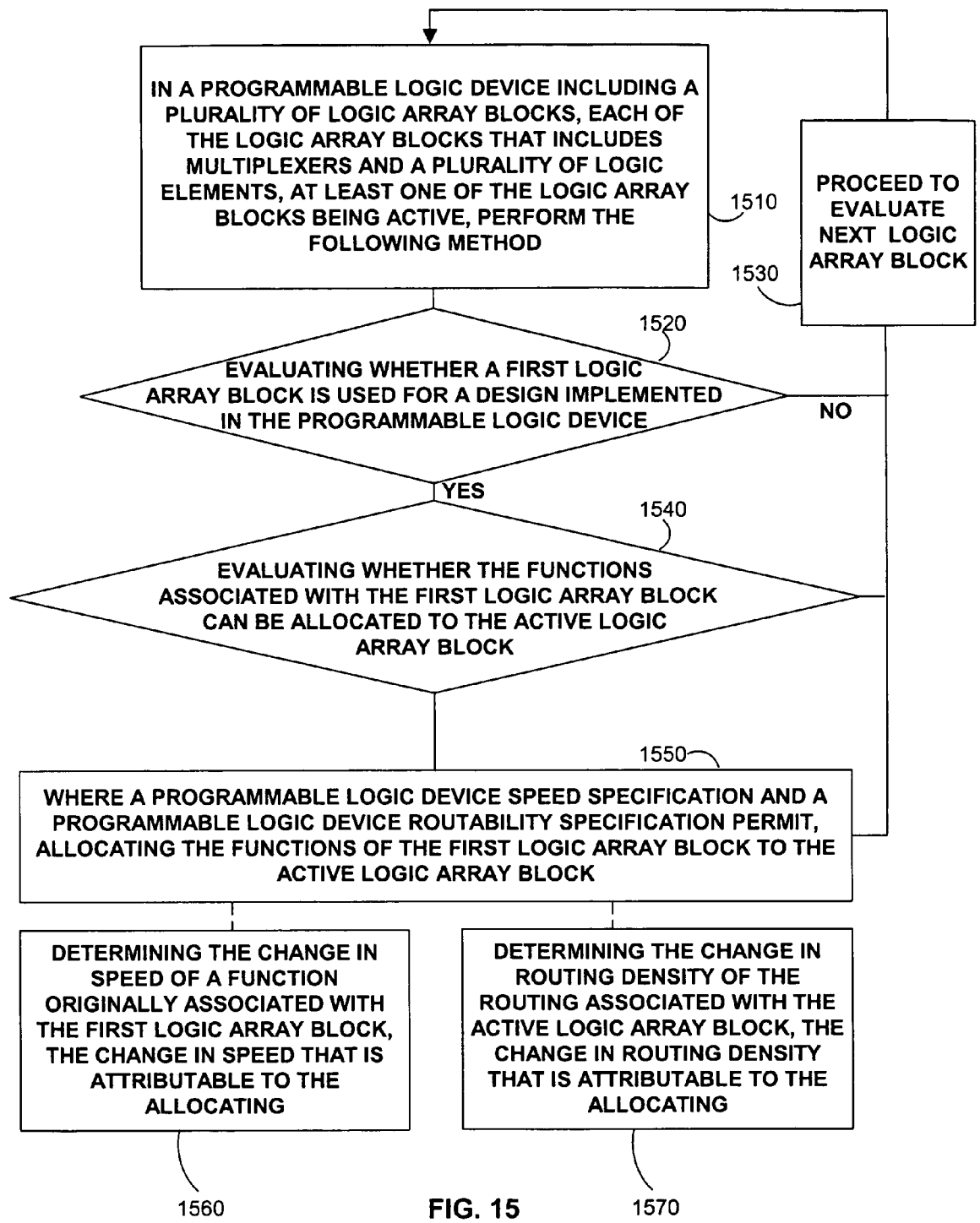

FIG. 14 shows a method for reducing power consumption in a programmable logic device. Step 1410 introduces the method which can be implemented either during a synthesis period, a placement period or a routing period. The method includes evaluating, during the aforementioned periods, whether a first logic element is used for a design implemented in the programmable logic device as shown in step 1420. Step 1430 shows proceeding to evaluate the next logic element when the first logic element is being used for the design. Step 1440 shows determining the state of the output of the first logic element that causes the programmable logic device to consume the least power. Step 1450 shows where a programmable logic device speed specification and a programmable logic device routability specification permit, setting the state of the output of the first logic element to the state that causes the programmable logic device to consume the least power. Step 1460 shows determining the change in speed of a function associated with the first logic element, the change in speed that is attributable to the setting, and step 1470 shows determining the change in routing density of the routing associated with the first logic element, the change in routing density that is attributable to the setting. Step 1475 shows evaluate, based on simulation vectors, whether one output state of the element is used predominantly during operation of the PLD. Step 1480 shows FIG. 15 shows a preferable method according to the invention related to logic array blocks as shown in step 1510. The method utilizes a programmable logic device with at least one active logic array block. The logic array block includes multiplexers and a plurality of logic elements. Step 1520 shows, if the first logic array block is being used, evaluating whether the functions associated with the first logic array block can be allocated to the active logic array block. Step 1530 shows looping back to evaluate a second logic array block if the first logic array block is not being used by the design. Step 1540 shows evaluating whether the functions associated with the first logic array block can be allocated to the active logic array block. If the functions associated with the first logic array block can be allocated to the active logic array block, then step 1550 shows, where a programmable logic device speed specification and a programmable logic device routability specification permit, allocating the functions of the first logic array block to the active logic array block. Where the functions of the first logic array block cannot be allocated to the active logic array block, then the method loops back to evaluate a second logic array block. Steps 1560 and 1570 show that, as part of the determination as to whether the specifications permit the allocating, determinations should preferably be made with respect to the changes in speed and routing density attributable, at least in part, to the allocation.

Figure 16:
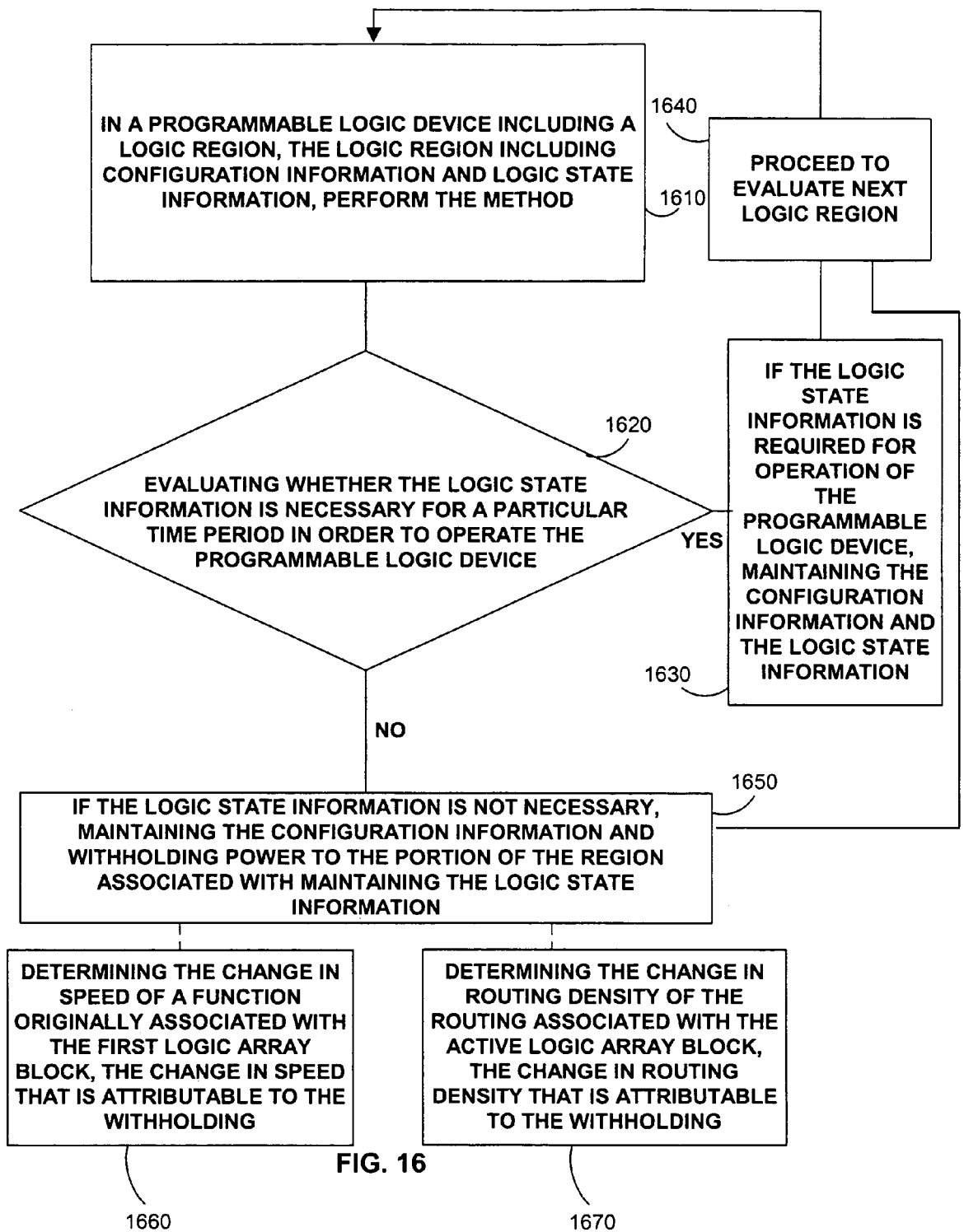

FIG. 16 relates to a method, as shown in step 1610, of saving power in a programmable logic device that includes a logic region that preferably includes configuration information and information relating to a logic state. Step 1620 shows evaluating whether the logic state information is necessary for a particular time period in order to operate the programmable logic device. Step 1630 shows if the logic state information is required for operation of the programmable logic device for the time period of evaluation, maintaining the configuration information and the logic state information, and then, in step 1640, looping back and evaluating a different logic region (or alternatively a different time period, (not shown)). Step 1650 shows if the logic state information is not necessary, maintaining the configuration information and withholding power (or reducing power consumption in some other suitable fashion) to the portion of the region associated with maintaining the logic state information. Steps 1660 and 1670 show that, as part of the determination as to whether the specifications permit the withholding power to the portion of the region associated with maintaining the logic state information, determinations should preferably be made with respect to the changes in speed and routing density attributable, at least in part, to the withholding.

In one embodiment of the invention described in FIG. 16, programming preferably includes creating appropriate placement so that the power-down logic corresponds to a power-down region of the chip, and that non-power-down logic is not put in this region. For example, in a future architecture similar to the Stratix described above with respect to FIG. 3, it may be that every pair of LABs forms a power-down region. The power-down logic should be packed into one or more lab pairs, and all non-power down logic should not be allowed to go into the lab pairs used.

Figure 17:
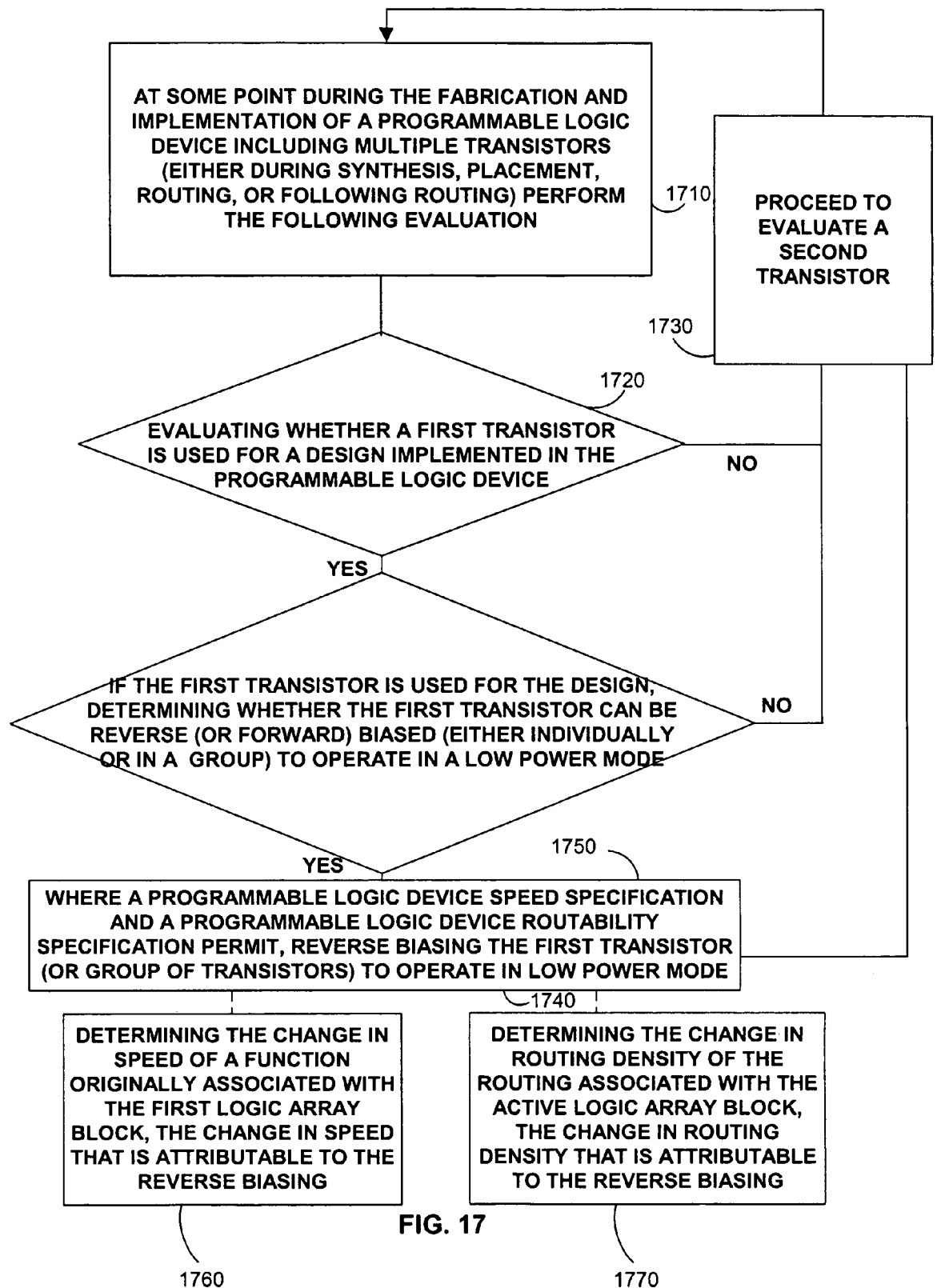

FIG. 17 relates to a method for reducing power on a transistor level in a programmable logic device. Step 1710 shows that the method may be implemented either during synthesis, placement, routing, or following routing. Step 1720 shows evaluating whether a first transistor is used for a design implemented in the programmable logic device.

Step 1730 shows that if the first transistor is not used for the design, then proceeding to evaluate a second transistor. If the first transistor is used for a design implemented in the programmable logic device, then step 1740 queries whether the first transistor can be reverse (or forward when added speed is desired) biased, either individually or as together with other transistors, to operate in a low power mode? If the first transistor cannot be reverse, or forward, biased, then proceed to evaluate a second transistor (or second group). If the first transistor can be reverse (or forward) biased, then, where a programmable logic device speed specification and a programmable logic device routability specification permit, step 1750 shows reverse (or forward) biasing the first transistor to operate in low power mode. Steps 1760 and 1770 show that, as part of the determination as to whether the specifications permit the reverse (or forward) biasing, determinations should preferably be made with respect to the changes in speed and routing density attributable, at least in part, to the reverse (or forward) biasing.

In one alternative embodiment of the invention shown in FIG. 17, the timing driven placement/routing of the programmable logic device may preferably be utilized to over-achieve timing goals in some portions of the circuit in order to allow other portions to be slowed-down via reverse bias of transistors. Also, an architecture may have a region of transistors that all need to be reverse biased as a group. In this case, placement of logic should aim to group different signal routing that can afford reverse biasing together—i.e., that can maintain the programmable logic device speed and area specifications. Preferably, such a method according to the invention maximizes the number of reverse bias groups that can be set in the low power mode.

Figure 18:
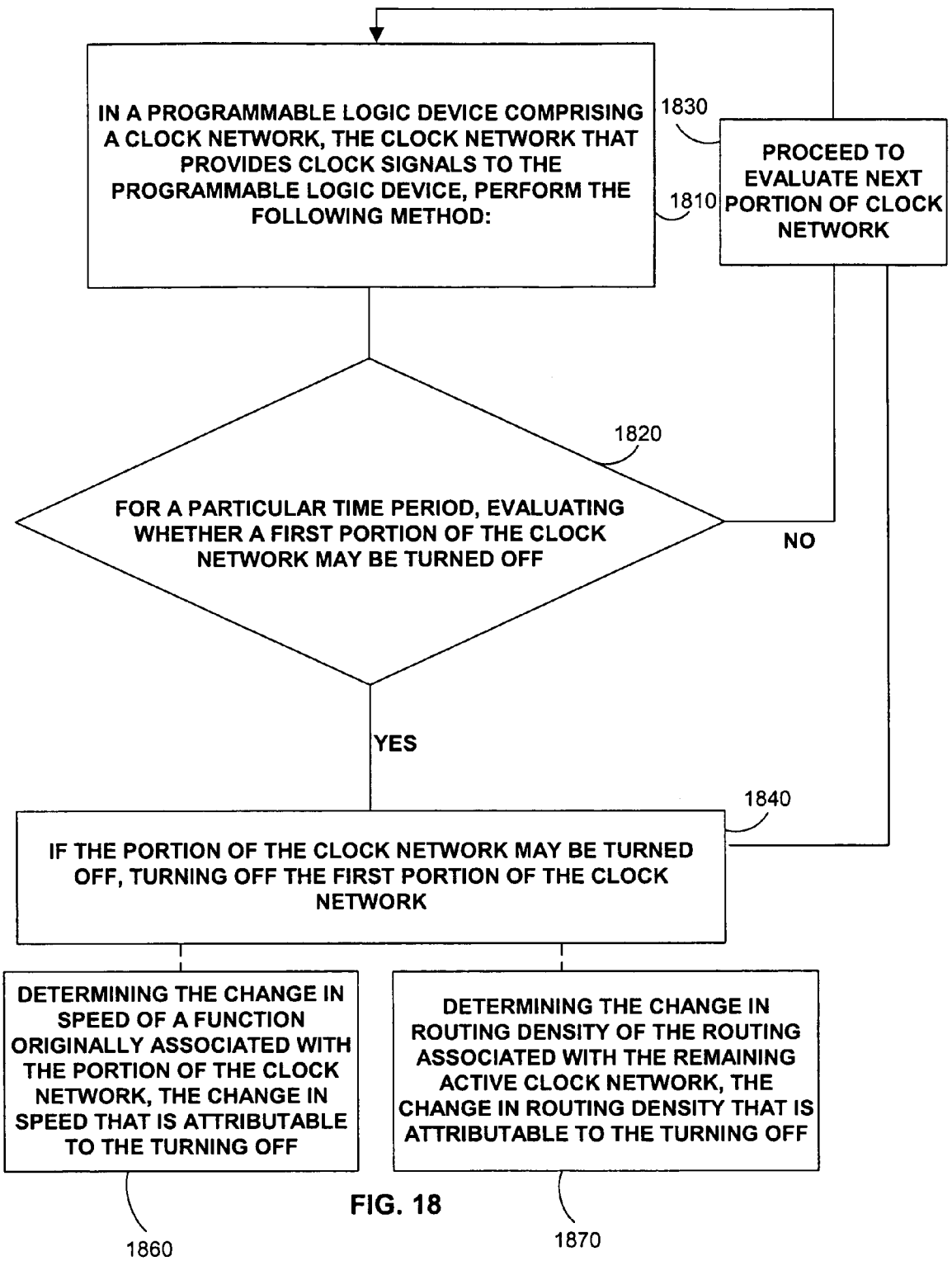

The flow chart in FIG. 18 shows yet another method according to the present invention. This method preferably is implemented on a programmable logic device including a clock network, as shown in step 1810. The clock network preferably comprises multiple branches that provide clock signals to different regions or quadrants in the programmable logic device. Step 1820 queries whether, for a particular time period, (or for a particular region of the PLD (not shown)) a portion or branch of the clock network may be turned OFF. Step 1830 shows that, if the answer to the query in step 1820 is NO, then the method may proceed to the next portion or branch of the clock network (or, alternatively, may evaluate a different time period for the same or different branch). Step 1840 shows if the portion of the clock network may be turned OFF, then, where permitted by speed and routing considerations (as shown in steps 1860 and 1870) that portion of the clock network should be turned OFF.

Figure 19:
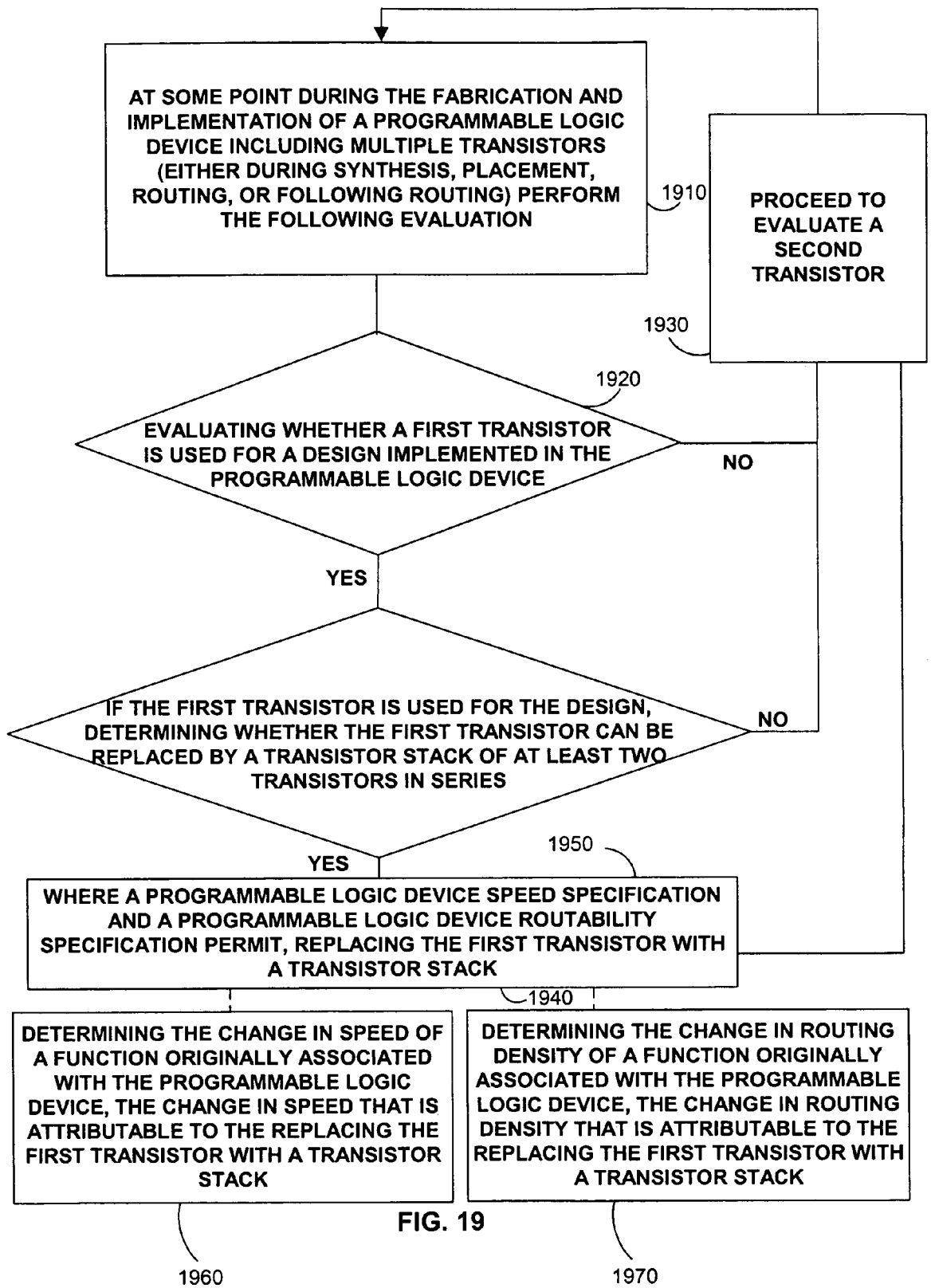

FIG. 19 relates to a method for reducing power on a transistor level in a programmable logic device. Step 1910 shows that the method may be implemented either during synthesis, placement, routing, or following routing. Step 1920 shows evaluating whether a first transistor is used for a design implemented in the programmable logic device.

Step 1930 shows that if the first transistor is not used for the design, then proceeding to evaluate a second transistor. If the first transistor is used for a design implemented in the programmable logic device, then step 1940 queries whether the first transistor can be replaced by a transistor stack of at least two transistors in series. If the first transistor cannot be replaced by a transistor stack, then proceed to evaluate a second transistor. If the first transistor can be replaced by a transistor stack, then, where a programmable logic device speed specification and a programmable logic device routability specification permit, step 1950 shows replacing the first transistor with a transistor stack. Steps 1960 and 1970 show that, as part of the determination as to whether the specifications permit the replacing the transistor with a transistor stack, determinations should preferably be made with respect to the changes in speed and routing density attributable, at least in part, to the replacing the first transistor with a transistor stack.

It should be noted that in one embodiment of the invention, a power calculus may be performed after each individual evaluation set forth in the preceding flow charts, as opposed to at the end of the circuit routing when many decisions may be difficult and time consuming to unwind.

Yet another aspect of the invention relates to evaluating whether a first logic element is used for a design implemented in the programmable logic device and, if the first logic element is not used for the design, searching for a second logic element that, if routed on routing that is proximal to the first logic element, reduces leakage current across transistors that are located between routing wires associated with the first logic element and routing wires associated with the second logic element. In one embodiment of this method, the second logic element may be selected by searching for a logic element whose output is substantially correlated to an output value of the first element. In another embodiment of this method, the an output of the first logic element may be replicated at the output of the second logic element in order to fully correlate the two logic elements. Furthermore, the replicating may include replicating a portion of the routing of the first element so as to reduce total leakage current. Finally, when the first logic element is known to have an unequal distribution of being in a ZERO output state (or, alternatively, a ZERO input state) and a ONE output state (or, alternatively, a ZERO input state), and where the second logic element is selected on the basis of the second logic element favoring in its distribution of a ZERO output state (or, alternatively, a ZERO input state) and a ONE output state (or, alternatively, a ZERO input state) the same value as the value favored by the first logic element.

Figure 20:
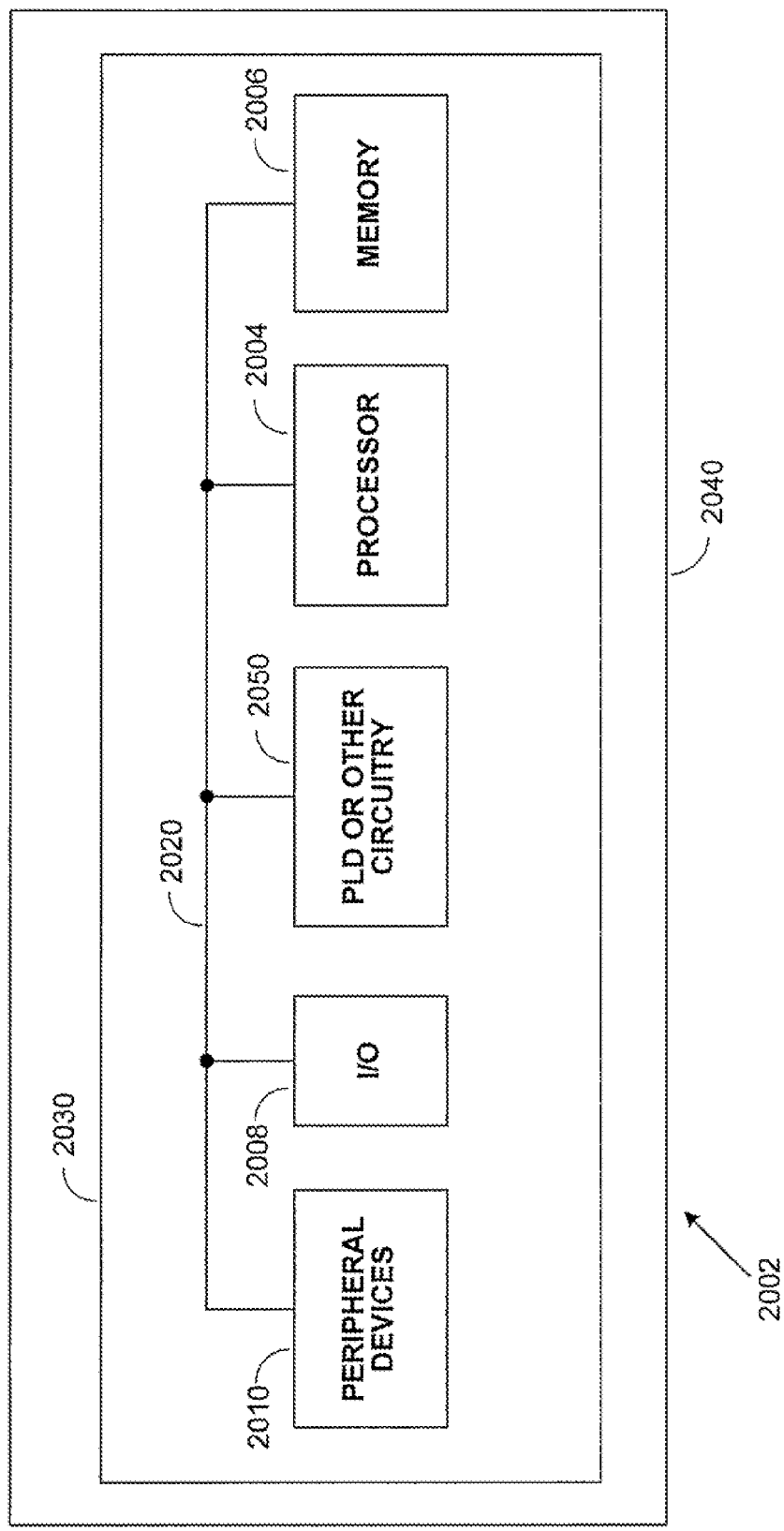
FIG. 20 is a simplified block diagram of an illustrative system employing circuitry in accordance with the invention.

FIG. 20 illustrates a PLD or other circuitry 2000 (such as a CPLD or structured ASIC, see footnote 1) in a data processing system 2002 that may incorporate methods in accordance with the invention. Data processing system 2002 may include one or more of the following components: a processor 2004; memory 2006; I/O circuitry 2008; and peripheral devices 2010. These components are coupled together by a system bus or other interconnections 2020 and are populated on a circuit board 2030 (e.g., a printed circuit board), which is contained in an end-user system 2040. Any of the interconnections between element 2050 and any other elements may be made in a manner known to one skilled in the art.

System 2002 can be used in a wide variety of applications, such as computer networking, data networking, instrumentation, video processing, digital signal processing, or any other application where the advantage of using programmable or reprogrammable logic is desirable. Circuitry 2050 (which may include a DPLL (digital phased lock loop or other suitable circuitry) or can be used to perform a variety of different logic functions. For example, circuitry 2050 can be configured as a processor or controller that works in cooperation with processor 2004. Circuitry 2050 may also be used as an arbiter for arbitrating access to a shared resource in system 2002. In yet another example, circuitry 2050 can be configured as an interface between processor 2004 and one of the other components in system 2002. It should be noted that system 2002 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method for reducing power consumption in a programmable logic device, the programmable logic device comprising a plurality of transistors, the method comprising:
evaluating, during a synthesis period relating to a first transistor or group of transistors, whether the first transistor or group of transistors is used for a design implemented in the programmable logic device;
if the first transistor or group of transistors is not used for the design, evaluating a second transistor or group of transistors;
if the first transistor or group of transistors is used for the design, determining whether the first transistor or group of transistors can be reverse biased to operate in a low power mode; and
if the first transistor or group of transistors can be reverse biased to operate in a low power mode and a programmable logic device speed specification and a programmable logic device routability specification permit, reverse biasing the first transistor or group of transistors to operate in low power mode.

2. The method of claim 1, further comprising determining the change in speed of a function associated with the first transistor or group of transistors, the change in speed being attributable to the reverse biasing.

3. The method of claim 1, further comprising utilizing at least one of synthesis programming, logic placement programming and routing programming to over-achieve timing goals in a portion of the programmable logic device in order to allow at least one transistor to be reverse biased while still meeting performance requirements for the programmable logic device.

4. The method of claim 1 further comprising grouping a plurality of signal routes into a region of the programmable logic device, the plurality of signal routes comprising transistors that may be reverse biased while maintaining the programmable logic device speed specification and the programmable logic device routability specification.

5. A method for reducing power consumption in a programmable logic device, the programmable logic device comprising a plurality of transistors, the method comprising:
evaluating whether a first transistor or group of transistors is used for a design implemented in the programmable logic device;
if the first transistor or group of transistors is not used for the design, evaluating a second transistor or group of transistors;
if the first transistor or group of transistors is used for the design, determining whether the first transistor or group of transistors can be reverse biased to operate in a low power mode;
if the first transistor or group of transistors can be reverse biased to operate in a low power mode and a programmable logic device speed specification and a programmable logic device routability specification permit, reverse biasing all transistors in a programmable logic device region to operate in low power mode.

6. A method for reducing power consumption in a programmable logic device, the programmable logic device comprising a plurality of transistors, the method comprising:
evaluating whether a first transistor or group of transistors is used for a design implemented in the programmable logic device;
if the first transistor or group of transistors is not used for the design, evaluating a second transistor or group of transistors;
if the first transistor or group of transistors is used for the design, determining whether the first transistor or group of transistors can be reverse biased to operate in a low power mode;
if the first transistor or group of transistors can be reverse biased to operate in a low power mode and a programmable logic device speed specification and a programmable logic device routability specification permit, reverse biasing all transistors in a programming element to operate in low power mode.

7. A method for reducing power consumption in a programmable logic device, the programmable logic device comprising a plurality of transistors, the method comprising:
evaluating whether a first transistor or group of transistors is used for a design implemented in the programmable logic device;

if the first transistor or group of transistors is not used for the design, evaluating a second transistor or group of transistors;

if the first transistor or group of transistors is used for the design, determining whether the first transistor or group of transistors can be reverse biased to operate in a low power mode;

if the first transistor or group of transistors can be reverse biased to operate in a low power mode and a programmable logic device speed specification and a programmable logic device routability specification permit, dynamically reverse biasing a plurality of transistors, to operate in low power mode, based on signals received during operation via an input pin.

8. A method for reducing power consumption in a programmable logic device, the programmable logic device comprising a plurality of transistors, the method comprising:

evaluating, during a synthesis period relating to a first transistor, whether the first transistor is used for a design implemented in the programmable logic device;

if the first transistor is not used for the design, evaluating a second transistor;

if the first transistor is used for the design, determining whether the first transistor can be reverse biased to operate in a low power mode; and if the first transistor can be reverse biased to operate in a low power mode and a programmable logic device speed specification and a programmable logic device routability specification permit, reverse biasing the first transistor to operate in low power mode.

9. A programmable logic device comprising:

a plurality of transistors, a first sub-plurality of said transistors being used for a design implemented in the programmable logic device, and a second sub-plurality of said transistors not being used for said design; and means for reverse-biasing at least some of the transistors in the second sub-plurality in order to reduce leakage current, the means for reverse-biasing being at least partly dynamically operable during programmable logic device operation based on signals received during operation via an input pin.

10. The device of claim 9, wherein:

a portion of the transistors in each region is adapted to be forward biased; and the device further comprises:

means for forward biasing at least some of said transistors that are not being reverse biased by the means for reverse biasing in order to speed up the operation of the transistors that are forward biased.

11. The device of claim 9 wherein the means for forward biasing is at least partly operable during operation of the programmable logic device based on signals received during operation via an input pin.

12. A method for increasing speed of signal propagation in a programmable logic device, the programmable logic device comprising a plurality of transistors, the method comprising:

evaluating, during a synthesis period relating to a first transistor or group of transistors, whether the first transistor or group of transistors is used for a design implemented in the programmable logic device;

if the first transistor or group of transistors is not used for the design, evaluating a second transistor or second group of transistors;

if the first transistor or group of transistors is used for the design, determining whether the first transistor or group of transistors can be forward biased to operate in a high speed mode; and if the first transistor or group of transistors can be forward biased to operate in a high speed mode and a programmable logic device power consumption specification and a programmable logic device routability specification permit, forward biasing the first transistor or group of transistors to operate in high speed mode.

* * * * *

UNITED STATES PATENT AND TRADEMARK OFFICE
CERTIFICATE OF CORRECTION

PATENT NO.         : 7,287,171 B1
APPLICATION NO.    : 10/796502
DATED              : October 23, 2007
INVENTOR(S)        : Vaughn Betz It is certified that error appears in the above-identified patent and that said Letters Patent is hereby corrected as shown below:

Cover Page, Item (75), "Inventors:" should be -- Inventor: --;
"David Mendel, Sunnyvale, CA (US);" should be deleted.

Signed and Sealed this

Ninth Day of December, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,287,171 B1 | Page 1 of 1 |
| APPLICATION NO. | : 10/796502 | |
| DATED | : October 23, 2007 | |
| INVENTOR(S) | : Mendel et al. | |

It is certified that error appears in the above-identified patent and that said Letters Patent is hereby corrected as shown below:

In the Specification

Column 14, line 45, "Step 1480 shows" should be -- If so, step 1480 shows, where conditions permit, implementing an inverter in order to set the output state of the first logic element to a minimum power setting. If not, proceed to step 1430. --

Signed and Sealed this
Fourteenth Day of October, 2014

Michelle K. Lee
*Deputy Director of the United States Patent and Trademark Office*